(12) United States Patent
Houk

(10) Patent No.: US 7,211,935 B1
(45) Date of Patent: May 1, 2007

(54) ENHANCEMENTS FOR ADHESIVE ATTACHMENT OF PIEZOELECTRIC MOTOR ELEMENTS TO A DISK DRIVE SUSPENSION

(75) Inventor: Galen D. Houk, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 11/423,887

(22) Filed: Jun. 13, 2006

Related U.S. Application Data

(60) Continuation of application No. 11/011,958, filed on Dec. 14, 2004, now abandoned, and a division of application No. 10/176,384, filed on Jun. 20, 2002, now Pat. No. 6,856,075.

(60) Provisional application No. 60/300,230, filed on Jun. 22, 2001.

(51) Int. Cl.
 *H01L 41/053* (2006.01)
(52) U.S. Cl. ........................... 310/348; 438/106
(58) Field of Classification Search ............... 310/348; 438/106
 See application file for complete search history.

(56) References Cited

U.S. PATENT DOCUMENTS

| | | | |
|---|---|---|---|
| 2,284,088 A | 5/1942 | Gerber | |
| 3,453,458 A | 7/1969 | Curran et al. | |
| 4,232,558 A | 11/1980 | Jon et al. | |
| 4,253,435 A | 3/1981 | McCandless | |
| 4,287,447 A | 9/1981 | Skoda et al. | |
| 4,559,697 A | 12/1985 | Sadamori | |
| 4,756,508 A | 7/1988 | Giachino et al. | |
| 5,690,610 A | 11/1997 | Ito et al. | |
| 5,808,835 A | 9/1998 | Fujiwara | |
| 5,825,262 A | 10/1998 | Inoue et al. | |
| 5,925,974 A | 7/1999 | Yamamoto et al. | |
| 6,112,400 A | 9/2000 | Frater et al. | |
| 6,134,087 A | 10/2000 | Khan et al. | |
| 6,157,522 A | 12/2000 | Murphy et al. | |
| 6,309,911 B2 | 10/2001 | Hyoudo et al. | |
| 6,835,318 B2 * | 12/2004 | Suzuki et al. | 216/13 |
| 6,873,034 B2 * | 3/2005 | Nakamura et al. | 257/680 |
| 7,026,706 B2 * | 4/2006 | Infantolino et al. | 257/678 |
| 7,148,609 B2 * | 12/2006 | Ishikawa et al. | 310/351 |

FOREIGN PATENT DOCUMENTS

| | | |
|---|---|---|
| JP | 57154921 | 9/1982 |
| JP | 58044732 | 3/1983 |
| JP | 11298281 | 10/1999 |
| JP | 200049272 | 2/2000 |

* cited by examiner

*Primary Examiner*—Thomas M. Dougherty
(74) *Attorney, Agent, or Firm*—Faegre & Benson LLP

(57) ABSTRACT

Adhesive attachment features for bonding piezoelectric motors to a load beam substrate. The attachment features have one or more reliefs under or partially under or adjacent to a piezoelectric transducer to control the flow of adhesive by limiting or influencing adhesive travel or flow and simultaneously preventing excessive adhesive fillet height adjacent the piezoelectric motor while simultaneously providing for improved bond strength between the piezoelectric element and the load beam.

7 Claims, 31 Drawing Sheets

ENHANCEMENTS FOR ADHESIVE ATTACHMENT OF PIEZOELECTRIC MOTOR ELEMENTS TO A DISK DRIVE SUSPENSION

CROSS-REFERENCE TO RELATED APPLICATION

This application is a divisional of application Ser. No. 10/176,384, filed Jun. 20, 2002, entitled ENHANCEMENTS FOR ADHESIVE ATTACHMENT OF PIEZOELECTRIC MOTOR ELEMENTS TO A DISK DRIVE SUSPENSION, the entire contents of which are hereby incorporated by reference.

FIELD OF THE INVENTION

The present invention relates to the field of disk drive suspensions having one or more piezoelectric transducers (PZT) attached to a substrate, typically made of stainless steel, arranged to operate as a limited range linear motor to position a distal end of the suspension laterally as desired.

BACKGROUND OF THE INVENTION

The prior art includes a non-etched area with one adhesive control feature in the form of a recessed line in the substrate located at the inner border of a bond pad area at each end of the piezoelectric transducer or motor to help prevent adhesive from wicking along the bottom surface of the motor beyond the bond pad area towards the center of the motor.

SUMMARY OF THE INVENTION

The present invention is an improvement for use with the adhesive attachment of piezoelectric elements used as linear motors on disk drive suspensions. The improvement is a relief under, partially under, or adjacent the piezoelectric transducer which helps control the adhesive by limiting or influencing adhesive travel or flow and simultaneously preventing excessive fillet height adjacent the PZT, while (also simultaneously) providing for sufficient adhesive bond area between the PZT and the supporting substrate to improve bond strength. Features of the invention in the substrate, which is normally stainless steel (S ST), include one or more recesses which are partially etched, through etched, coined, laser cut, or otherwise made in the motor attachment area of the substrate.

The preferred configuration is one in which the adhesive attach enhancement features may border up to three sides of each end of a PZT motor with sufficient width extending laterally outside and away from the motor to either limit the adhesive travel or allow excess adhesive to be drawn away from the motor. It may also have features or topography extending towards the corners of the motor. The substrate topography may be either recessed in relation to the surrounding area or include a raised portion in the substrate recess to encourage better filling of adhesive into the corners of the bond pad area of the PZT. In the practice of the present invention, it is preferred that there be sufficient area under the motor bond region that is not recessed to create an adhesive cushion that helps provide for an adequate bond line thickness. This thickness may be enhanced by including conductive particles in adhesive or by including controlled-size non-conductive particles added to the adhesive for this purpose. The exact shapes of the raised and recessed areas can be varied, depending on the improvements required.

The present invention provides the following additional improvements:

1. Added adhesive joint strength. The mix of recessed and non-recessed areas provides a better mechanical bond for the adhesive to the SST. In suspensions without the adhesive attach enhancement features of the present invention, the observed failure mode is at the SST to adhesive interface. With recessed control features of the present invention, the failure plane remains the same at the un-etched areas but the failure mode at the recessed areas is changed to one within the adhesive. This provides opportunities to increase the strength of the joint by increasing the adhesive's internal strength.

2. Complete bond pad area coverage. It has been observed that the motor attach adhesive bond's strength is diminished when the bond pad area is not completely filled with adhesive. Using the adhesive control features of the present invention allows enhanced movement of the uncured adhesive into the corners of the bond area thus helping to maximize the coverage of adhesive in the bond area.

3. Control of adhesive fillets. The adhesive in an un-etched pad area tends to make a fillet going up the sides of the PZT motor. These fillets can short out the motor if they contain conductive particles and extend up to the top conductive surface. Because of this, the maximum height of these fillets is specified for production of such parts, and parts not meeting the specification are rejected for this condition. These fillets do provide some additional mechanical strength to the adhesive joint. The additional strength provided by the adhesive attach enhancement features (as stated in #1) helps counter the loss of strength seen from eliminating or reducing the fillets. In some cases, these fillets have also been linked to a decrease in the stroke (movement) of the PZT motor.

4. Process robustness. The fillet condition in #3 and the incomplete bond pad condition in #2 are inversely related. As the adhesive volume is increased to ensure a complete bond pad, the number of rejectable fillets are also in danger of increasing. When the height of the adhesive fillets is lowered by decreasing the adhesive volume, the number of incomplete bond pads tends to increase. This relationship contributes to a small adhesive volume operating window. A very small volume of adhesive is used in this process and it is difficult to control precisely. This window of adhesive volume variability is widened considerably by using adhesive attach enhancement features of the present invention to control excess adhesive. This excess adhesive control allows the process to operate on the high-side of allowable adhesive volume, simultaneously promoting full bond pads without excessive fillets.

5. Potential for more design freedom. The adhesive attach enhancement features of the present invention allow flexibility in designing TSA parts by helping control the shape of the bond pad. Adhesive that is placed on the part either by pin transfer or syringe dispensing or similar methods tends to form in the shape of a dot in its liquid form due to surface tension of the adhesive and wetting characteristics of the adhesive and the material that it is placed in contact with. This round dot shape makes it more and more difficult to meet the above conflicting fillet and bond area requirements as the bond pad shape becomes more rectangular (less square). The adhesive attach enhancement features of the present invention have shown potential for allowing the designer to have slightly higher aspect ratio (width to length ratio) bond pad designs. This is a result of the adhesive either being forced to the desired areas by troughs or encouraged to go there by the effects of the adhesive attach enhancement features on the wetting characteristics and surface tension of the adhesive.

6. Processing equipment set aid. All of the adhesive enhancement features provide a visually perceptible reference to determine if the adhesive is being placed within the proper area. Designs with features at the motor end and sides make motor locating easier. The features used to control adhesive may desirably be made larger than the PZT motor up to as large as the placement tolerance zone. This would make motor placement set up much easier.

BRIEF DESCRIPTION OF THE DRAWINGS

FIG. 4b is a photograph of the PZT mounting region in the load beam of FIG. 4a.

FIG. 10c is a drawing of a portion of the load beam showing the mounting region corresponding to FIG. 10a.

DETAILED DESCRIPTION

Figures 1, 2, 3:
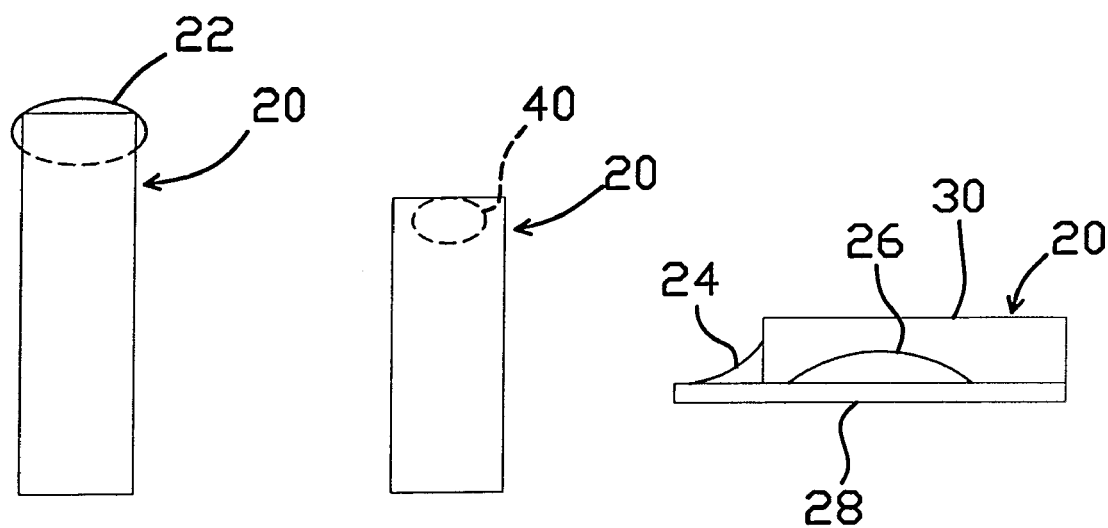
FIG. 1 is a simplified top view of a PZT which shows a large adhesive volume that spreads out on the stainless steel suspension.
FIG. 2, which is a side view of the PZT and adhesive of FIG. 1
FIG. 3 shows a top view of a PZT motor with a small adhesive volume and no fillets.

Referring to FIGS. 1, 2 and 3, the drawings show possible extremes of adhesive dot size and shape that can occur without adhesive attachment enhancements. FIG. 1 is a simplified top view of a PZT 20 which shows a large adhesive volume 22 that spreads out on the stainless steel suspension 28. This causes large adhesive fillets 24, 26 as shown in FIG. 2, which is a side view of the PZT and adhesive of FIG. 1. These fillets make the PZT to stainless joint stronger but if they are large enough, they can short the stainless steel 28 to the plated conducting top surface 30 of the PZT 20. This shorting problem causes the motor 20 to become inoperative. Referring now also to FIG. 4c, if the adhesive 34 spreads from the motor 20 all the way to a base plate 32, the relative movement of the base plate 32 to the suspension 28 could cause adhesive particles to be flaked off, resulting in contamination in the drive. The load beam 36 (formed of a load beam blank 38) of the suspension 28 is essentially a spring mounted to a stiff base plate 32. Movement of the spring with respect to the base plate occurs during the operating life of the suspension 28. It is typical of suspensions under consideration here that bending is used to give required spring force and offset. The suspension is flexed during subassembly and drive assembly operations. During drive operation, the suspension is flexed when the suspension is parked at power down and it is also flexed by various resonance and windage movements. Large fillets also expose more surface area of the adhesive to the drive atmosphere.

FIG. 3 shows a top view of a PZT motor with a small adhesive volume 40 and no fillets. It produces a weak joint because of the small bond area. All testing to this point has shown a direct, but inverse, relationship between bond area and shear strength of the joint. The manufacturing process needs to operate in a range that produces full bond pads, i.e., an actual bond pad that equals or approximates the maximum available bond pad area) while not producing fillets that are too large. This operating window could narrow even more if the exposed adhesive becomes a concern.

Figure 4A:
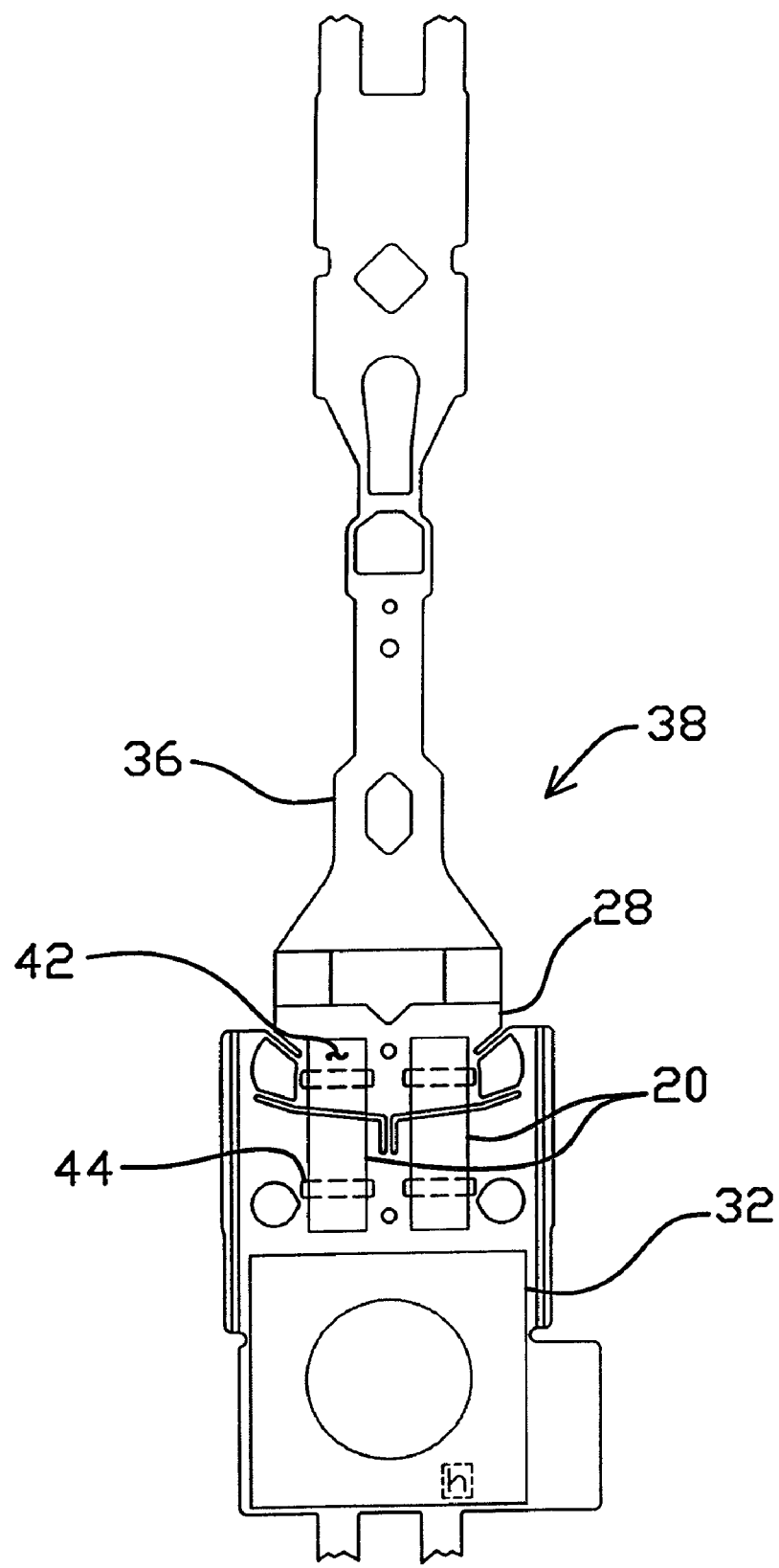
FIG. 4a is a top view of a load beam assembly with a prior art adhesive control arrangement for PZT motors used on the load beam for a disk drive head suspension.
Figure 4B:
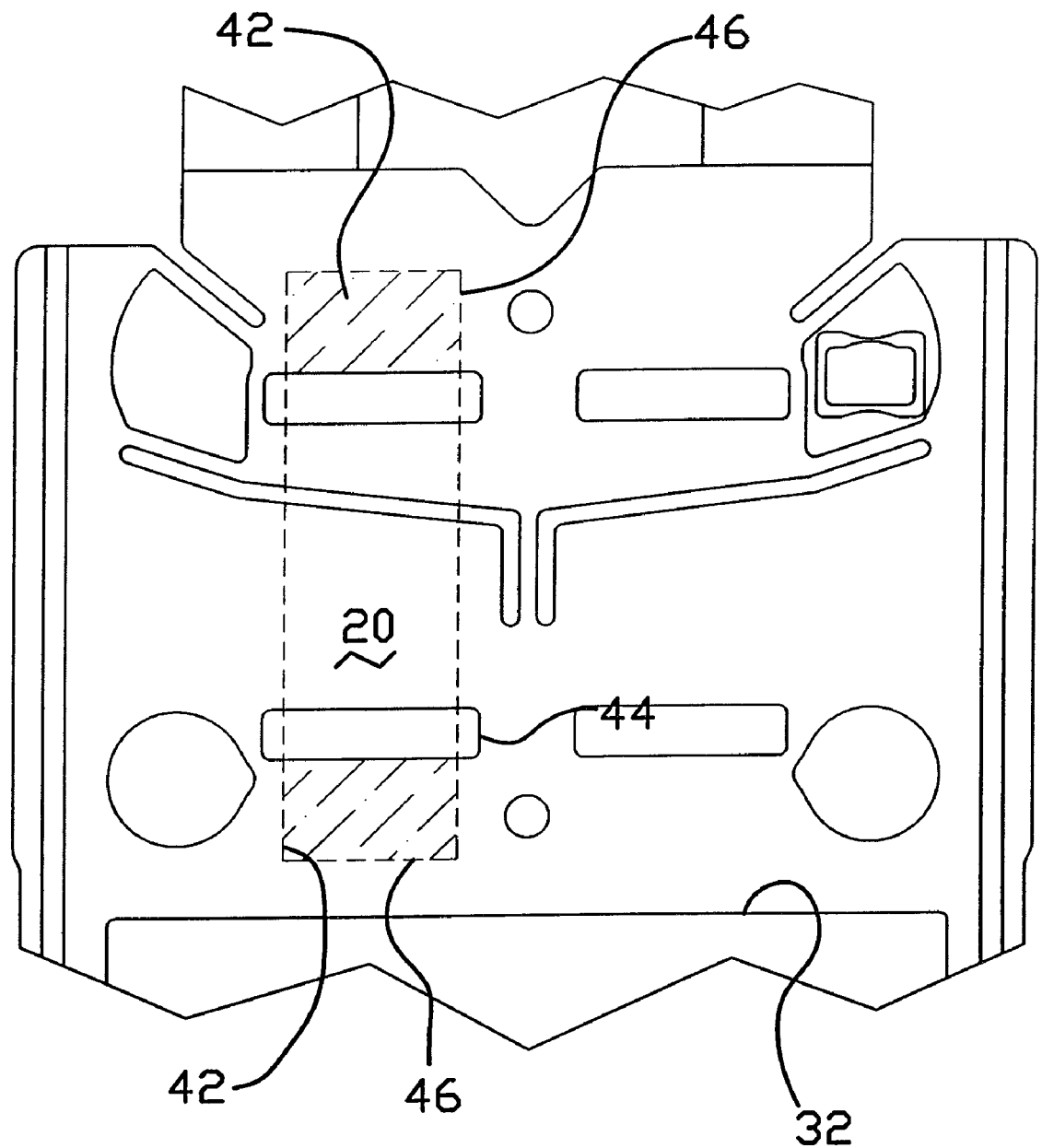
Figure 4C:
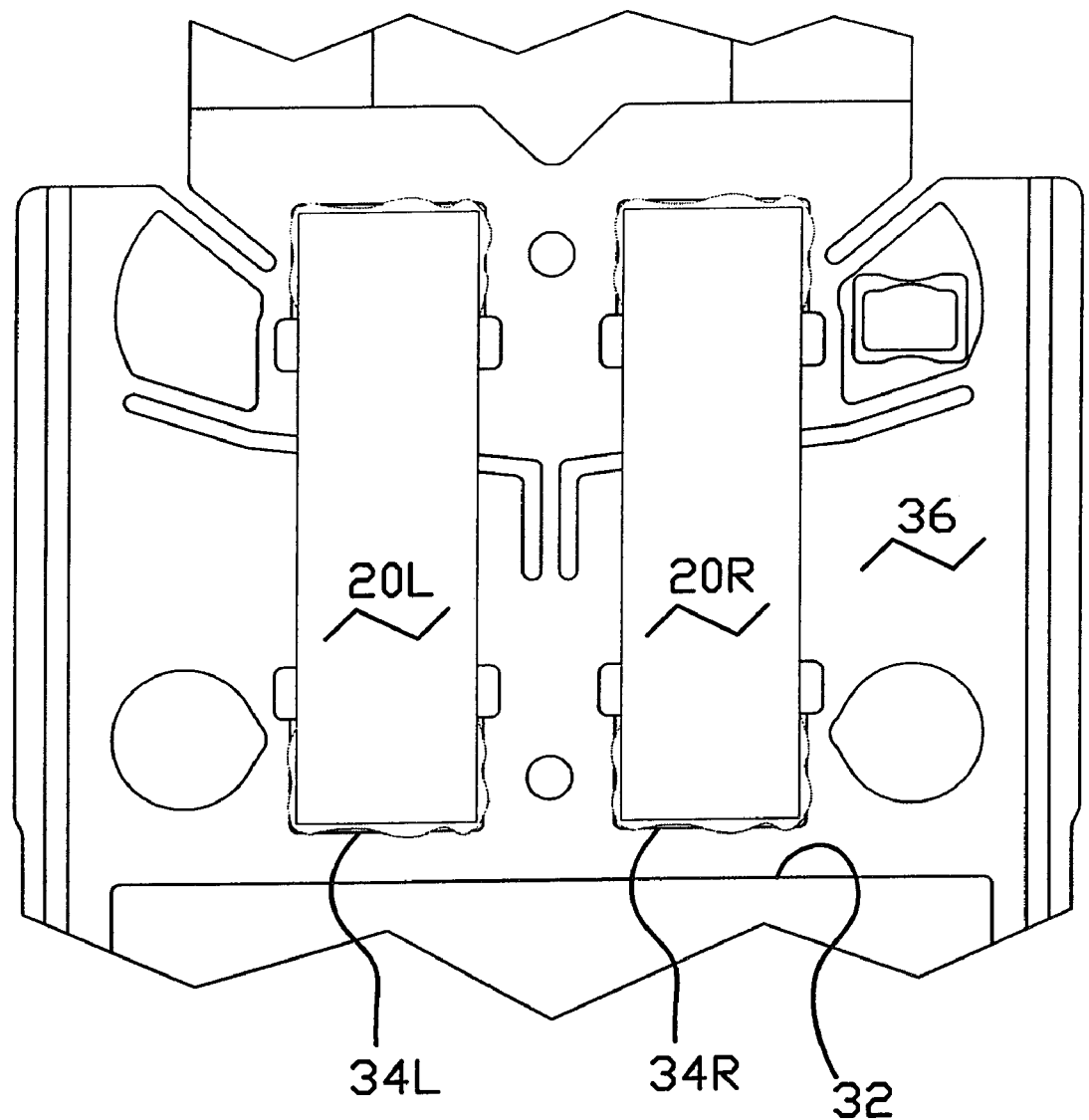
FIG. 4c is a photograph of the PZT mounting region of FIG. 4b with the PZT motors attached.

Referring now most particularly to FIGS. 4a, 4b, and 4c, the prior art includes a non-etched area 42 with one adhesive control feature in the form of a recessed line or relief 44 in the substrate 28 located at the inner border of a bond pad area 46 at each end of the piezoelectric transducer or motor 20 to help prevent adhesive from wicking along the bottom surface of the motor beyond the bond pad area 46 towards the center of the motor. It is to be understood that the bond pad area 46 is the maximum available bond pad area, and that the maximum bond pad area may be different at opposite ends of the motor, but is preferably the same at each end of the motor.

FIGS. 4–15 show the standard control part (in FIGS. 4a and 4b) as used now, and three main categories of modified designs useful in the practice of the present invention (in the remaining Figures) designated A, B, and C. Category A includes designs with recessed features at the edges of the motor only. Category B includes designs with recessed features under the motor with possible addition of recessed edge features. Category C includes designs with the entire bond area under the motor recessed and with features raised up in this recessed area. Undercuts at the edges of the motors may be used for certain desired results, such as to avoid fillet buildup, provided the consequential reduction in bond surface area is acceptable. The undercut is preferably limited to be only enough to allow for positional tolerance in the motor placement, to maintain the undercut below the motor.

FIGS. 4a, 4b, and 4c show various views of a prior art adhesive control arrangement for PZT motors used on a load beam for a disc drive head suspensions. In FIG. 4a, a drawing of a load beam blank 38 with a pair of PZT motors 20 may be seen. An enlarged view in the form of a microphotograph of the PZT mounting region 20' (including the bond pad areas 46) may be seen. The PZT mounting region 20' is shown enclosed by a dashed line, and the bond pad areas 46 are indicated by dashed hatching. The adhesive control feature 44 of the prior art is only at the inboard end or inner border of the bond pad area 46 at each end of the piezoelectric transducer, or motor, to help prevent adhesive from wicking along the bottom surface of the motor beyond the bond pad area 46 toward the center of the motor. Referring now to FIG. 4c, the left motor 20L on this part has adhesive 34 that has spread out enough to be very close to the base plate 32. Adhesive 34R may be seen to be spaced further from base plate 32 for the right hand motor 20R.

Figure 5A:
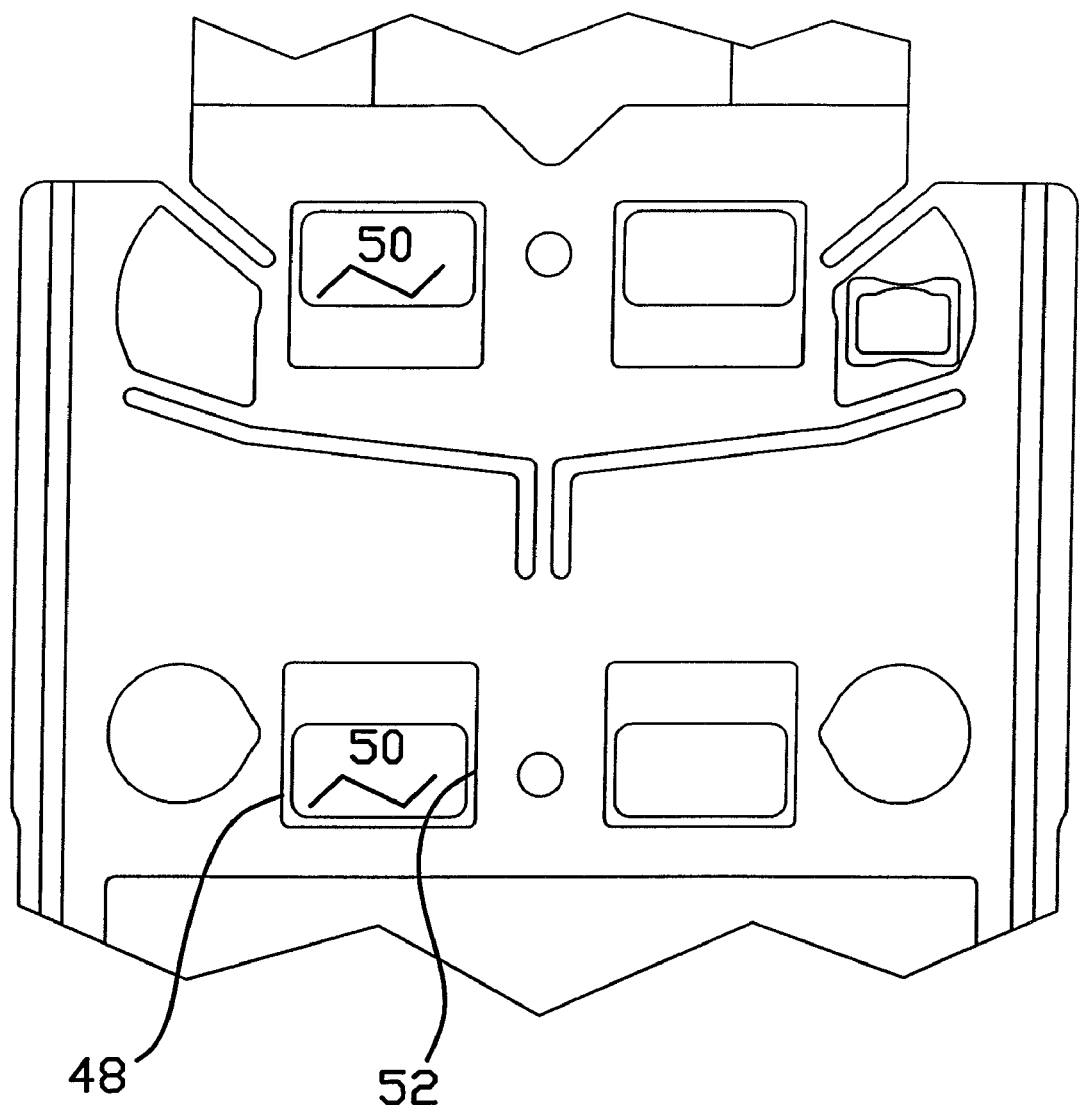
FIG. 5a is a photograph of a PZT mounting region according to a first embodiment of the present invention.
Figure 5B:
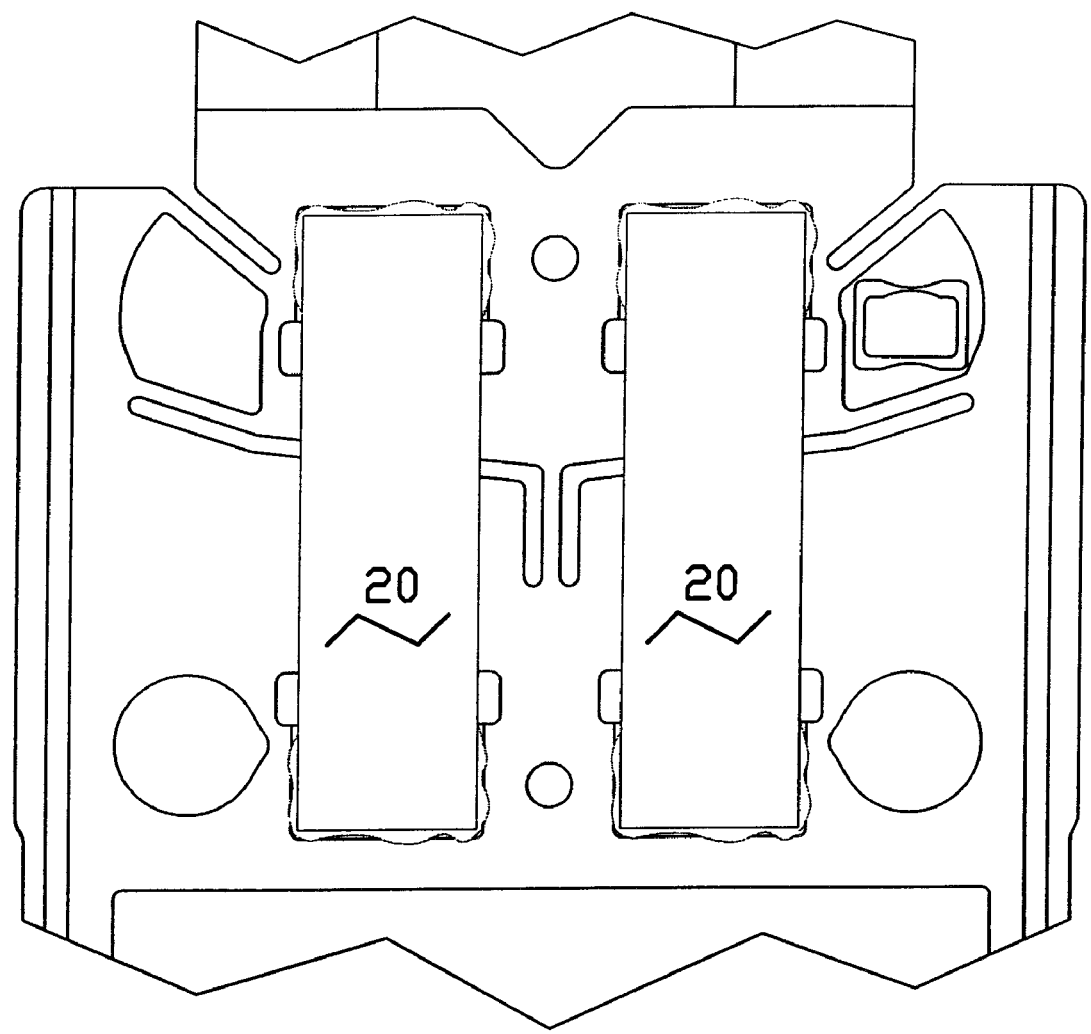
FIG. 5b is a photograph of a PZT mounting region of FIG. 5a with the PZT motors attached.

Referring now to FIGS. 5a and 5b, a first design (#1) of a first embodiment of an attachment feature 48 in Category A may be seen. In FIG. 5b, the PZT motors 20 are 1 mm wide by 3.5 mm long. The unetched pads 50 in FIGS. 5a and 5b are 0.9 mm wide, 0.55 mm long, and 3.4 mm from outside end to outside end. This provides a 0.05 undercut on each side of the motor. This was done to help control the fillet size on the sides of the motors but still provide mechanical adhesive strength by filleting down into the groove 52 forming the attachment feature 48. The concept of using a trough or groove 52 to eliminate or reduce the size of fillets seems to work very well if the motor 20 is placed so that edges of the motor extend over the trough 52, as shown in FIG. 5b. The shear strength of this design is lower than the control group. It appears that this may be related to bond pad area. The undercut area of this design results in about a 22% reduction in actual bond pad area. With a control average shear strength of 3008 gf (grams force), a reduction of 22% results in 2346 gf, which is close to the 2555 average of design #1. This seems to indicate that while control features that undercut the motor reduce or eliminate fillets they also decrease shear strength. The optimum condition is to have no fillet while still maintaining adequate bond strength. In practice, it may be found desirable to maintain a small fillet to maintain adequate bond strength while simultaneously avoiding approaching shorting conditions as the fillet size increases.

Figure 6A:
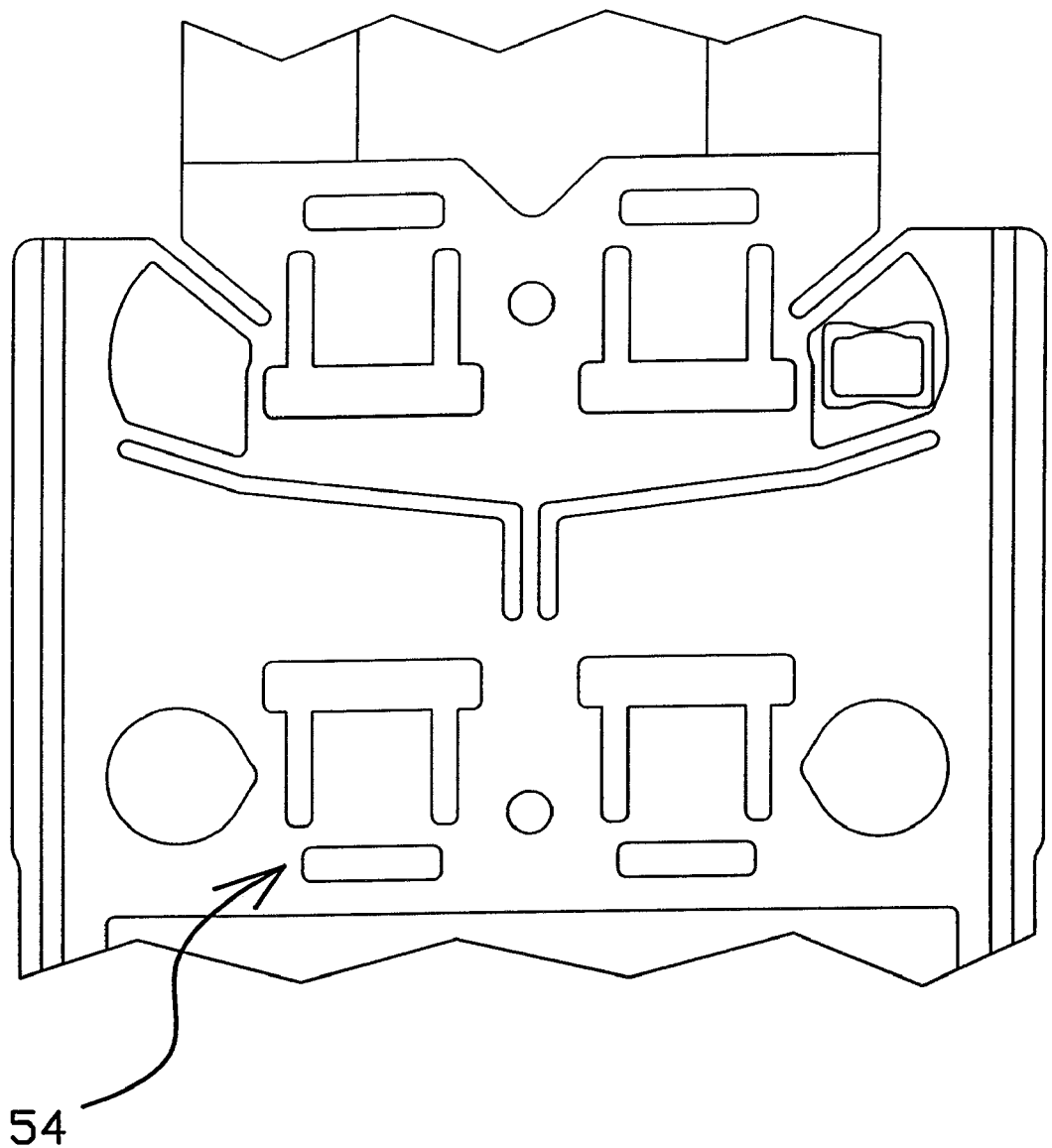
FIG. 6a is a photograph of a PZT mounting region according to a second embodiment of the present invention.
Figure 6B:
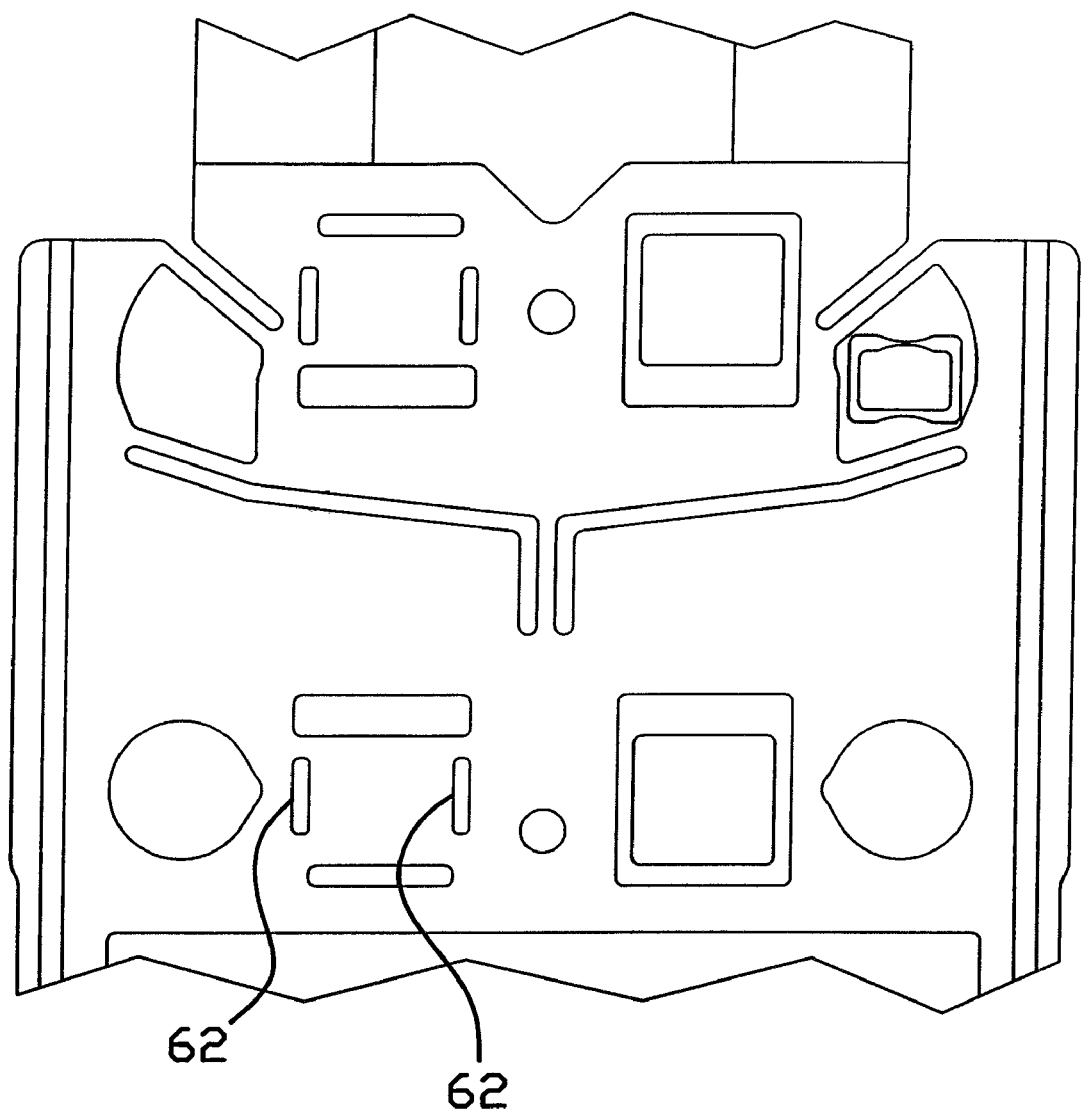
FIG. 6b is a photograph of a PZT mounting region with both discontinuous and continuous recesses shown for the reliefs for mounting PZT motors to a substrate.
Figure 6C:
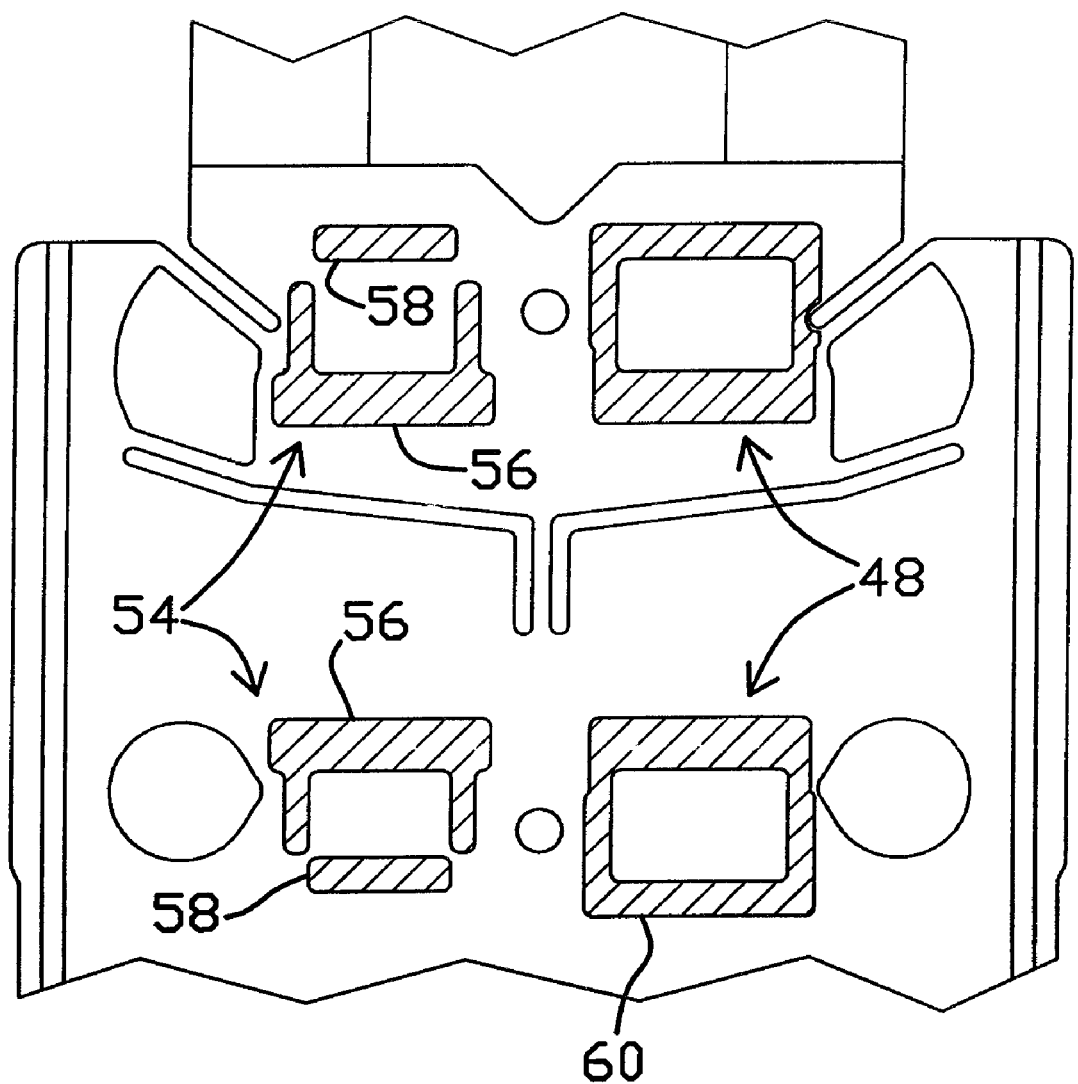
FIG. 6c is a drawing of the PZT mounting region corresponding to FIG. 6b showing recesses in the substrate hatched.

Referring now to FIGS. 6a, 6b, and 6c, a second design of an attachment feature 54 in Category A may be seen on the left hand side of FIGS. 6a and 6c. In FIG. 6c, the hatched areas 56, 58 indicate reliefs or recesses in the substrate. Hatched area 60 also indicates a relief in the substrate corresponding to the attachment feature 48 of FIG. 5a. The Category A design #2 attachment feature 54 is similar to design #1 (i.e., attachment feature 48) except that the recessed area is not continuous around the bond pad area of the motor. The side troughs are of different lengths, as shown. The design pictured in FIG. 6a worked very well. The left side of FIG. 6b shows side troughs 62 from an earlier test that were too short. The short troughs can cause a high fillet. This also occurred on some of the left hand motor parts shown in FIG. 6b. This seemed to indicate that with excessive adhesive, shifted motor placement, the groove stopping the adhesive from going as close to the base, and a narrower groove; the adhesive could travel up farther on the motor end. The base of the fillet was only as wide as the groove so the fillet became narrower but higher. Because of this it is believed that a full length trough has more robustness to excessive adhesive than a partial trough. On the other hand the shear strength of design #2 was slightly better than design #1. This is believed to be due to the slight increase in bond pad area near the outer corners. There was 20% less bond pad area with this design compared to the control. A 20% reduction of the control 3008 gf would give a calculated 2406 gf compared to 2621 actual gf.

Figure 7A:
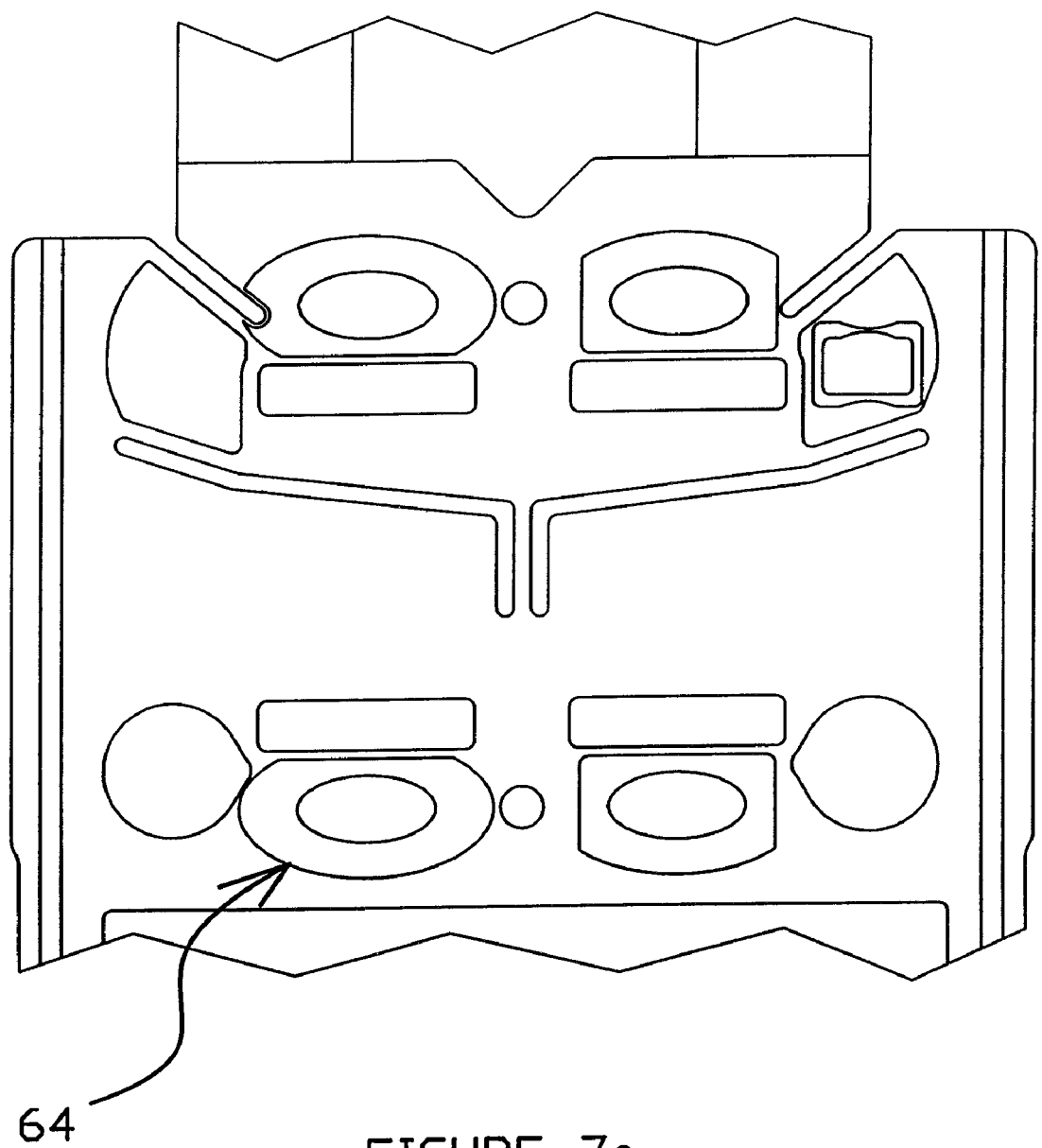
FIG. 7a is a photograph of a PZT mounting region according to a third embodiment of the present invention.
Figure 7B:
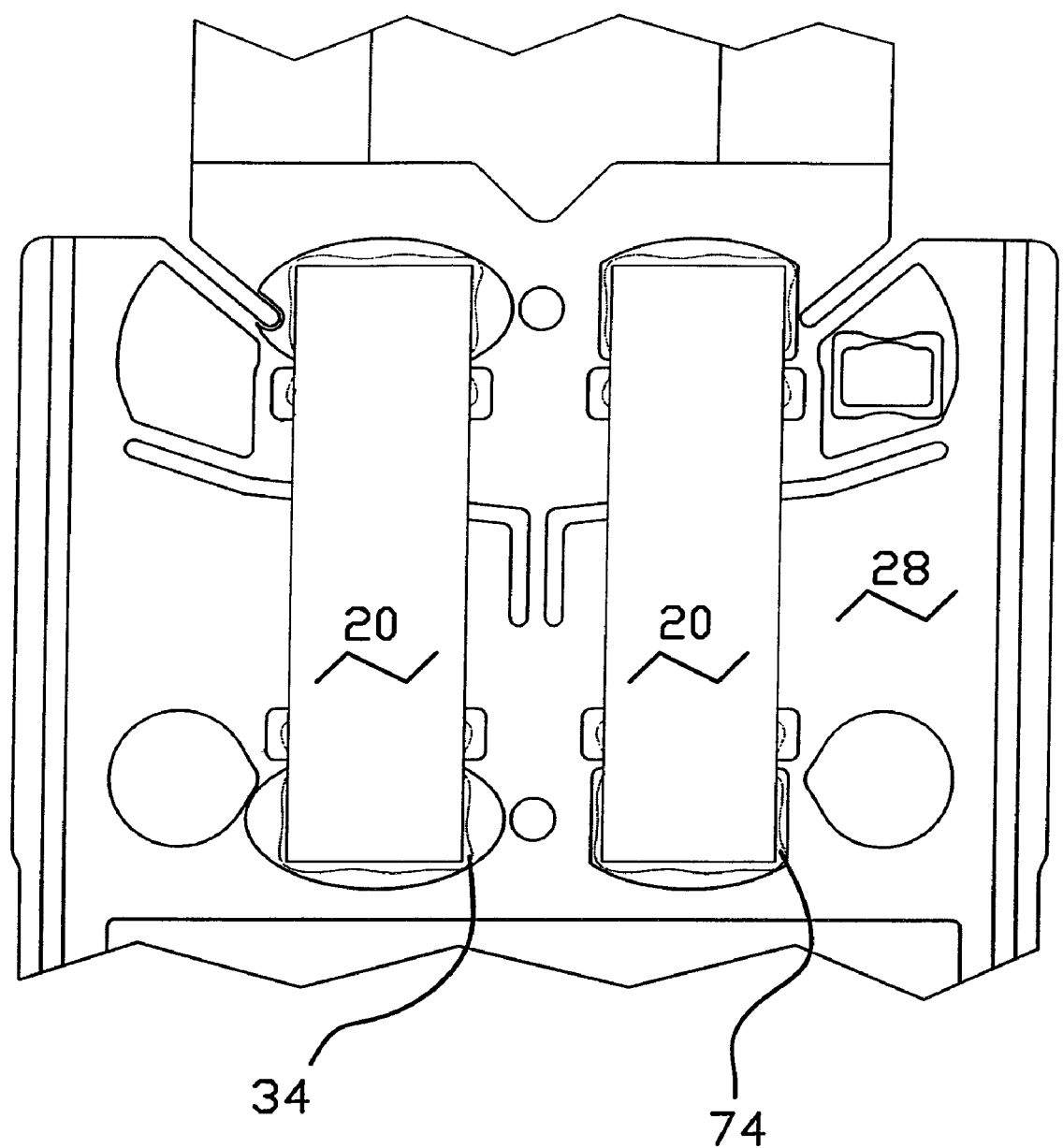
FIG. 7b is a photograph of the mounting region of FIG. 7a with the PZT motors attached.
Figure 7C:
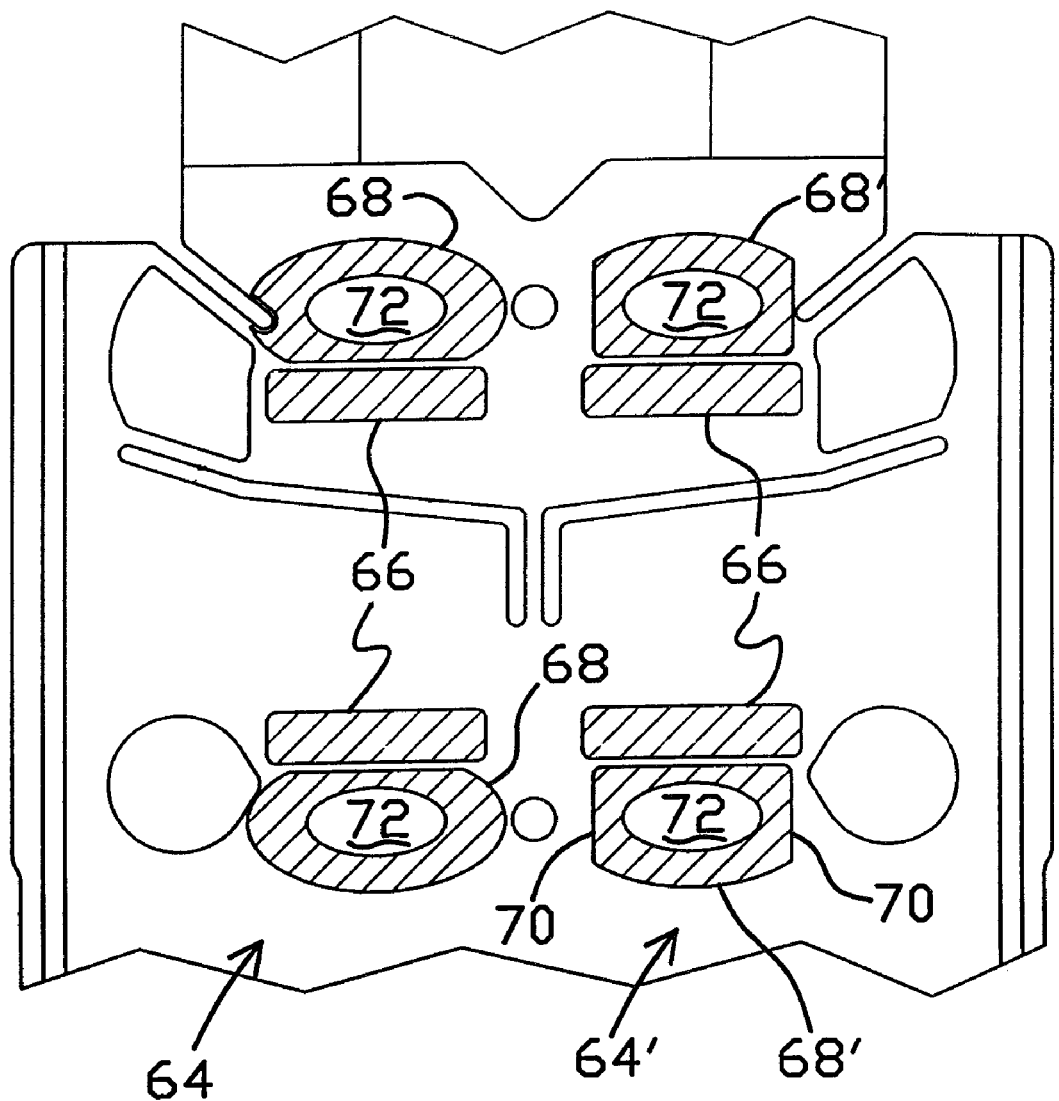
FIG. 7c is a drawing of the PZT mounting region of FIG. 7a showing recesses in the load beam substrate as hatched areas.

Referring now to FIGS. 7a, 7b, and 7c, a third design in the form of an attachment feature (in two slightly varying forms, 64, 64') in Category A may be seen. In FIG. 7c, the hatched areas 66, 68, and 68' indicate reliefs. Category A design #3 was intended to define the adhesive dot area and encourage the corners to fill. There were two variations 64, 64' of this design tested. Variation 64 has oval shaped sides for relief 68, while variation 64' has straight sides 70 for relief 68'. While this design was intended to have the adhesive in the areas outside the PZT motor drawn by capillary action to the corners of the elements, test results indicated that the adhesive did not fill the outboard corners of the bond pad area even with the highest volume of adhesive. Only one part of this type had wicking towards the center of the motor. This design is believed to be useful to eliminate stress concentrations in the adhesive pad corners. The round or oval adhesive pad 72 in conjunction with the round or oval trough 68 or 68' and a higher strength adhesive is expected to provide good strength without the stress concentration of a sharp corner. As may be seen in FIG. 7b, the adhesive 34 is retained in oval relief 68, while adhesive 34 forms a fillet 74 along straight side 70 of relief 68'.

Figure 8A:
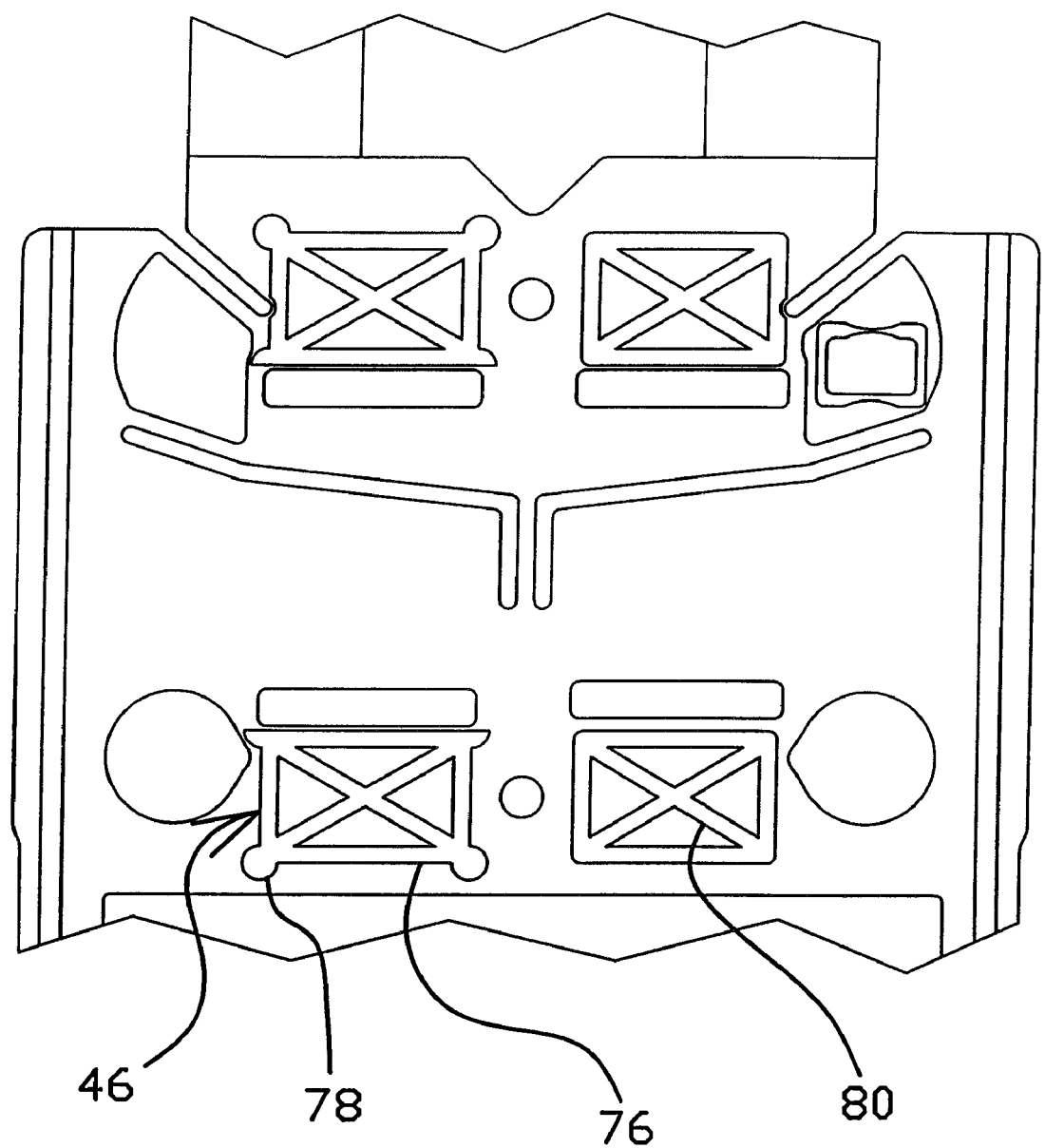
FIG. 8a is a photograph of a PZT mounting region according to a fourth embodiment of the present invention.
Figure 8B:
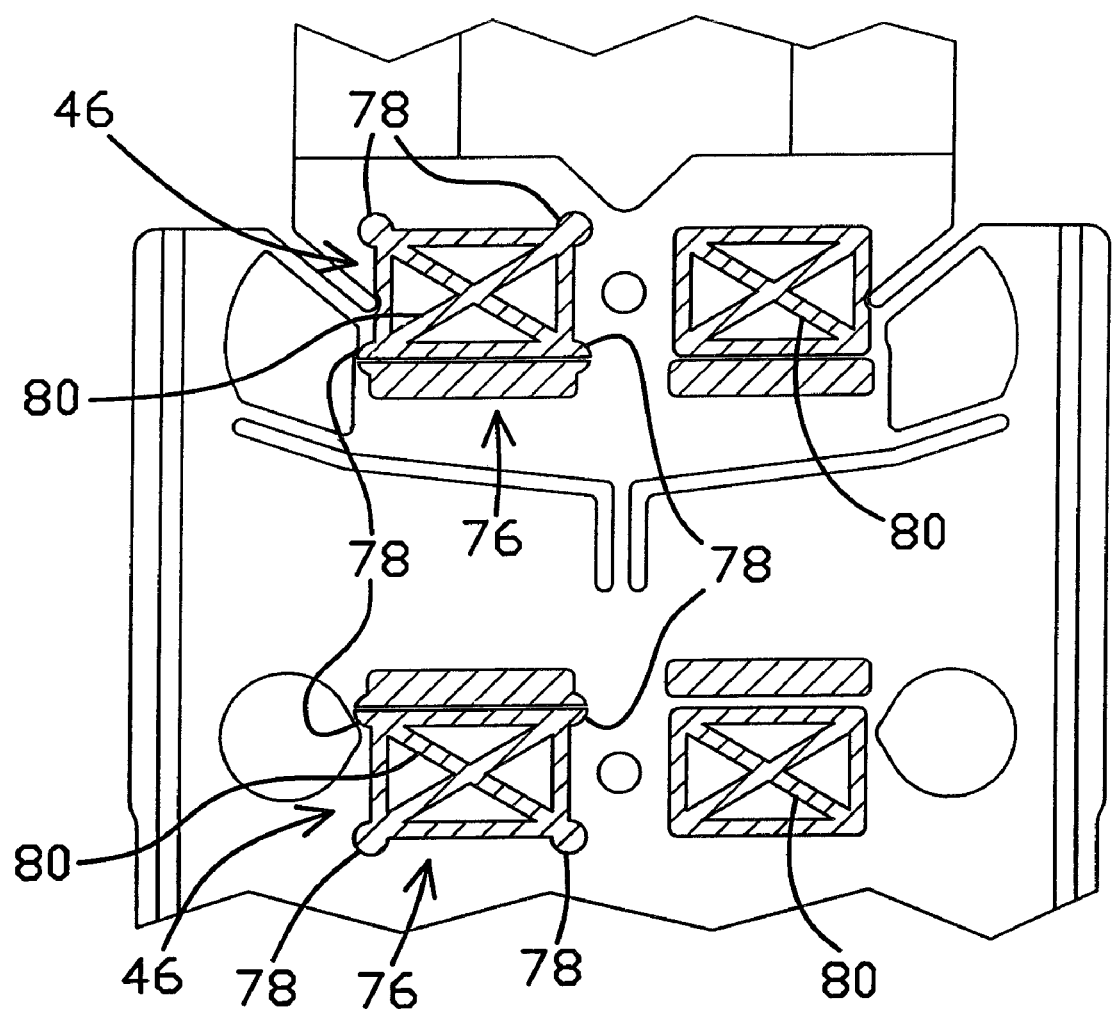
FIG. 8b is a drawing of the PZT mounting region of FIG. 8a showing recesses in the load beam substrate as hatched areas.

Referring now to FIGS. 8*a* and 8*b*, a first design in Category B may be seen. Two versions of this design may be seen, with the left hand version 76 having projections 78 extending from each of the corners of the bond pad areas 46. As may be seen most clearly in FIG. 8*b*, the hatched areas indicate etched or otherwise relieved portions in the bond pad areas 46. Category B design #1 was intended to provide more adhesive to the corners of the bond pad area. When adhesive is placed between flat surfaces that don't wet well the surface tension of the adhesive will cause it to make a round pad. The X shaped relief 80 was added so that when the PZT element was placed on the substrate, it would pump the adhesive out to the corners of the bond pad area. This could become much more important as bond pad aspect ratios get higher and the pads become more rectangular. Another purpose for the X shaped relief 80 is to provide better mechanical bonding of the adhesive to the suspension. This design worked well except that minor wicking problems were observed on some parts, and the corners weren't always filled. There were adhesive fillets but they were low enough as a whole and would be lower yet if the partial etch extended under the edge of the motor 0.1 mm as described in Category A above. The round reservoirs 78 at the corners (beyond the bond pad area) of pattern 76 are provided to hold excess adhesive, if needed.

Figure 9A:
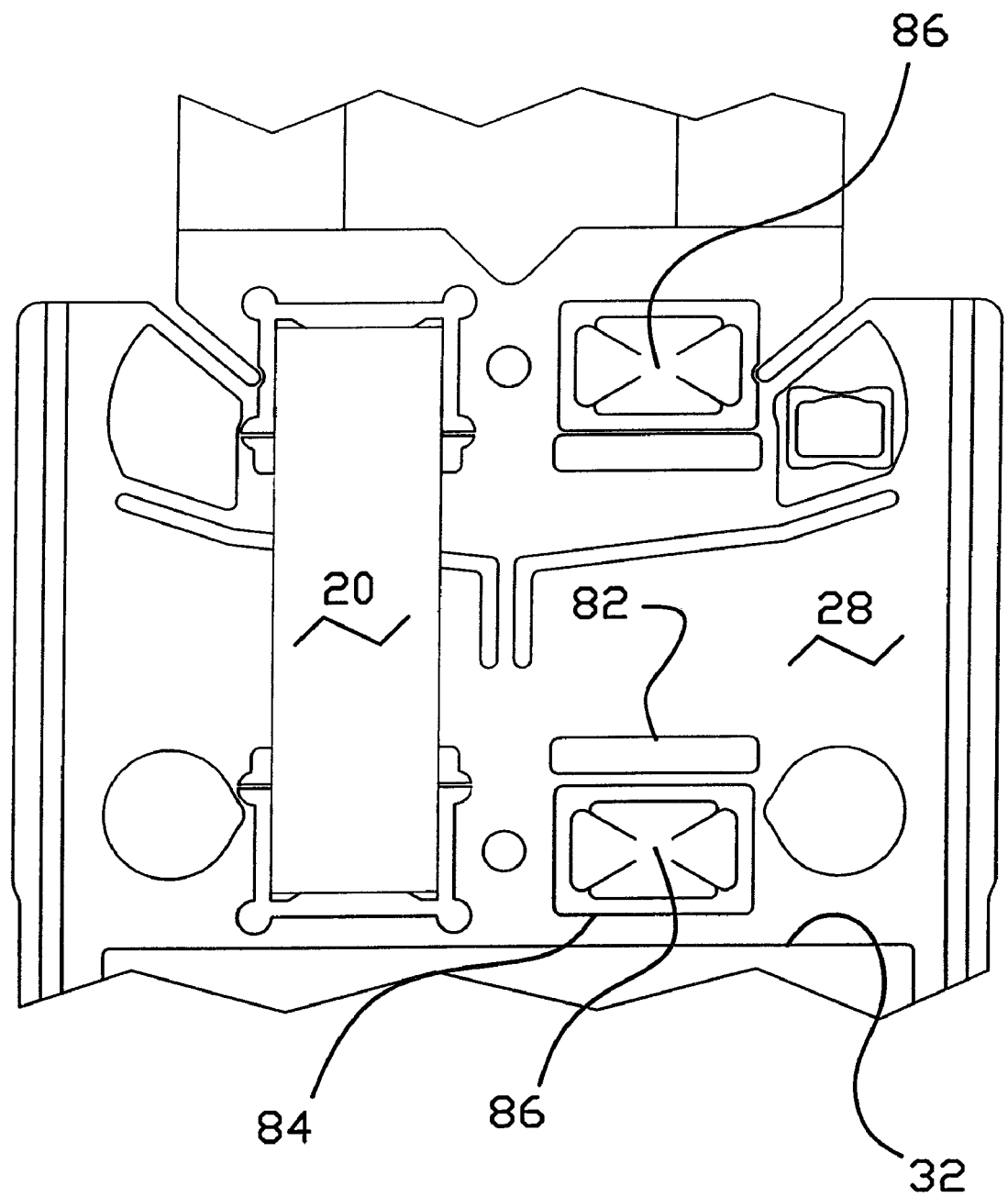
FIG. 9a is a photograph of a PZT mounting region according to a fifth embodiment of the present invention with one PZT motor present and one PZT motor absent.
Figure 9B:
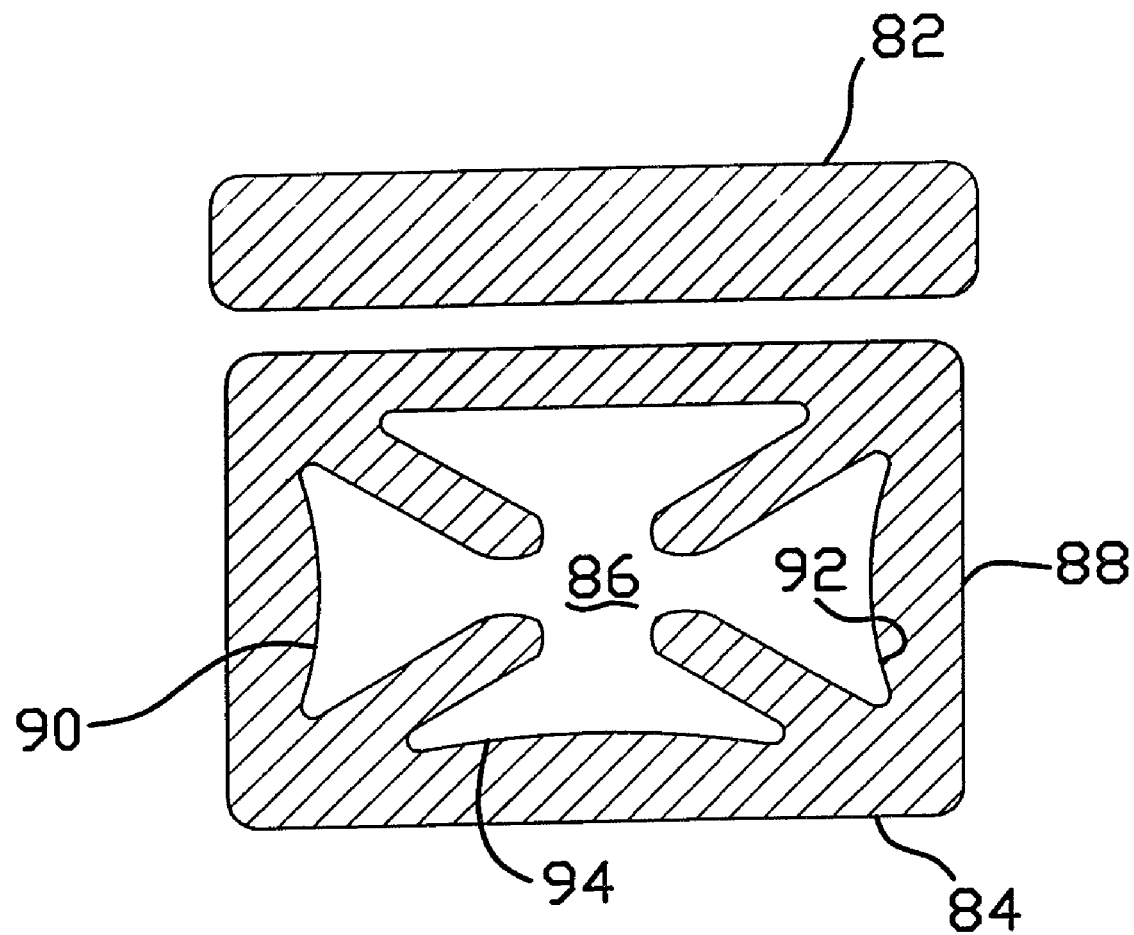
FIG. 9b is an enlarged drawing of a PZT attachment feature of FIG. 9a, with hatched areas indicating recesses in the substrate to which the PZT motor is to be attached.

Referring now to FIGS. 9*a* and 9*b*, a second design in Category B may be seen. The hatched areas 82, 84 in FIG. 9*b* indicate recesses. Category B design #2 was designed with a cross-shaped land 86 surrounded by recessed portion 84 having a rectangular outer periphery 88. This was done to provide more of an adhesive cushion in the center of the bond pad. This cushion helps provide a thicker bondline and thus helps prevent wicking of adhesive between the motor and the suspension in the unbonded section of the motor. The outside edges 90, 92, and 94 of the center pad 86 were also made concave to help prevent fillets. The recessed features were intended to be larger similar to those in the first test (Category A, design #1). It is apparent that the adhesive did mechanically lock into the recessed areas. This is believed to help increase shear strength.

Figure 10A:
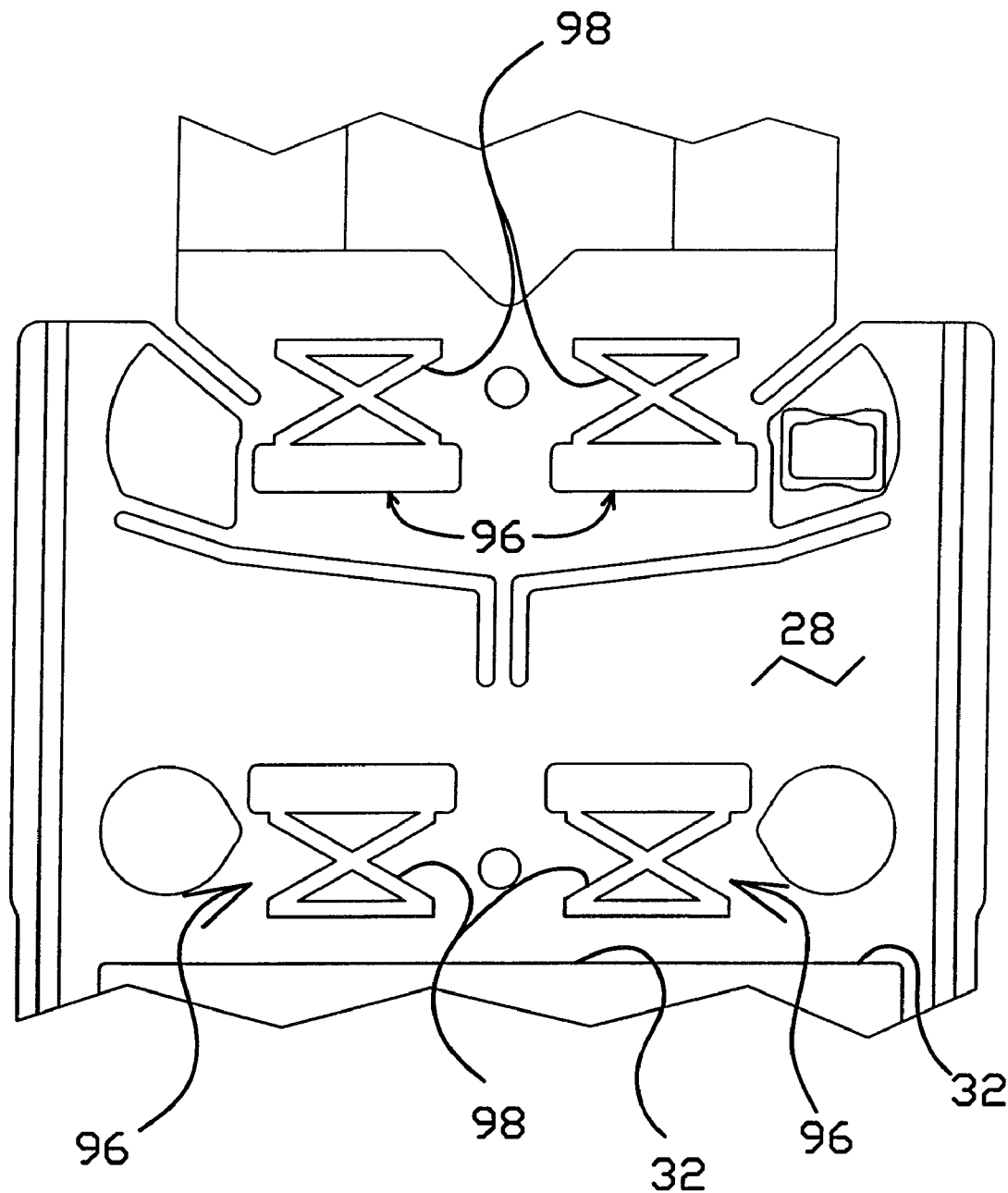
FIG. 10a is a photograph of a PZT mounting region according to a sixth embodiment of the present invention.
Figure 10B:
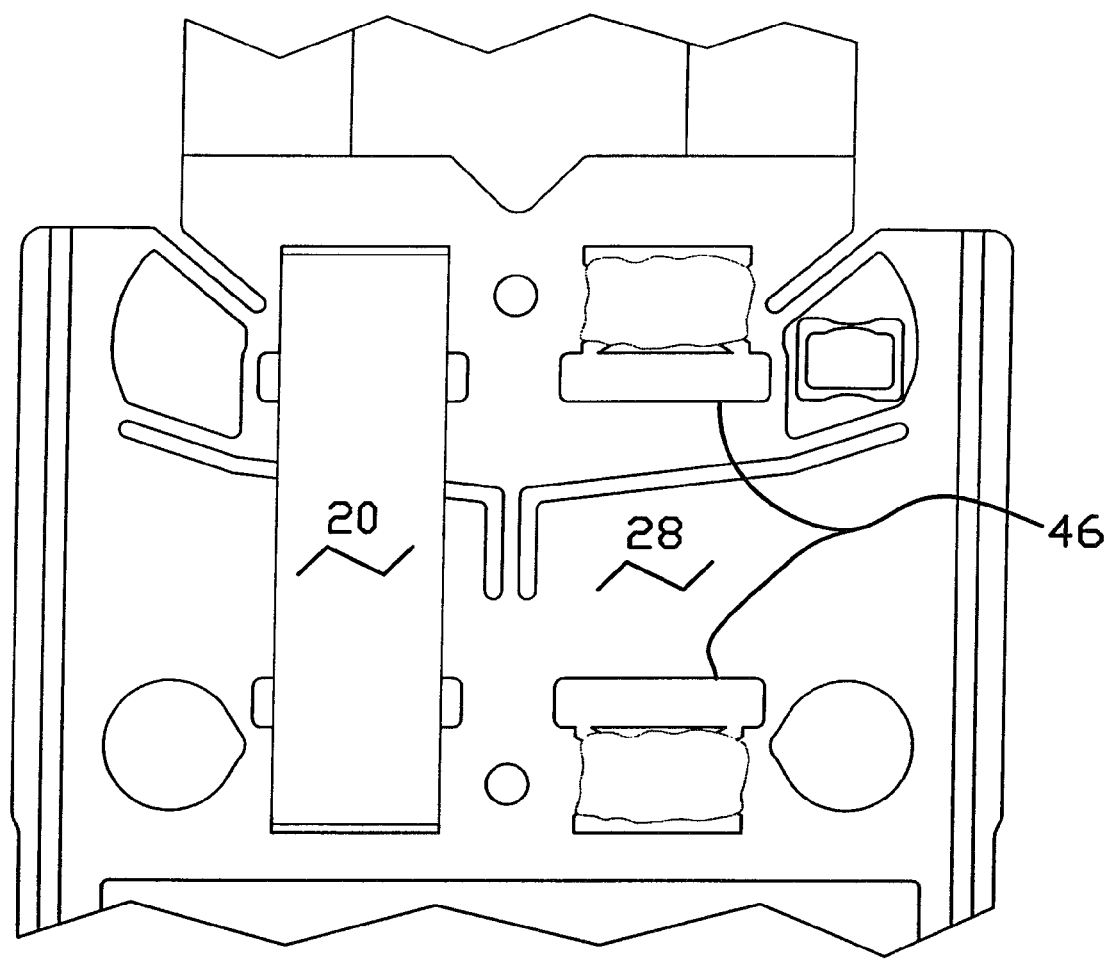
FIG. 10b is a photograph similar to FIG. 10a except with one PZT motor attached, and one motor removed to show the adhesive pattern achieved with this embodiment.
Figure 10C:
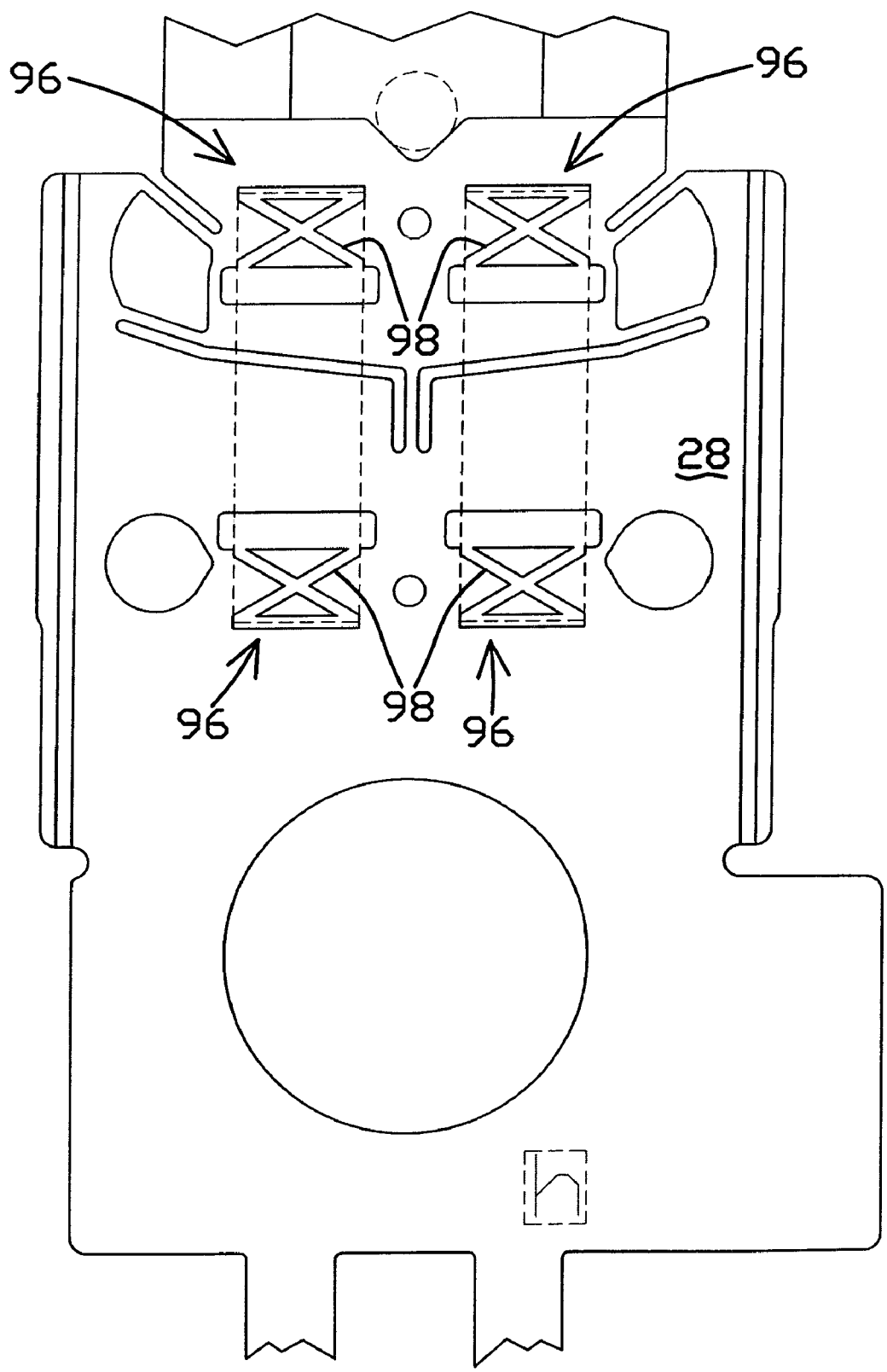

Referring now to FIGS. 10*a*, 10*b*, and 10*c*, a third design in Category B may be seen. FIG. 10*c* is a line drawing to more clearly illustrate the recess pattern 96 shown in microphotograph 10*a*. Category B design #3 eliminated the side recessed features and shortened the outside of end pad to outside of end pad distance to 3.4 mm as described above. The parts looked very uniform with no fillets. The X shaped grooves 98 under the motors required more adhesive volume than was available. This resulted in bond pad areas 46 that were not completely filled, as may be seen in the right hand side of FIG. 10*b*. This may have been the cause of lower shear strength numbers for this part compared to category A design #1 and #2 parts. With the present adhesive the X shaped recesses 98 did not add enough strength to overcome the incomplete pads.

Figure 11A:
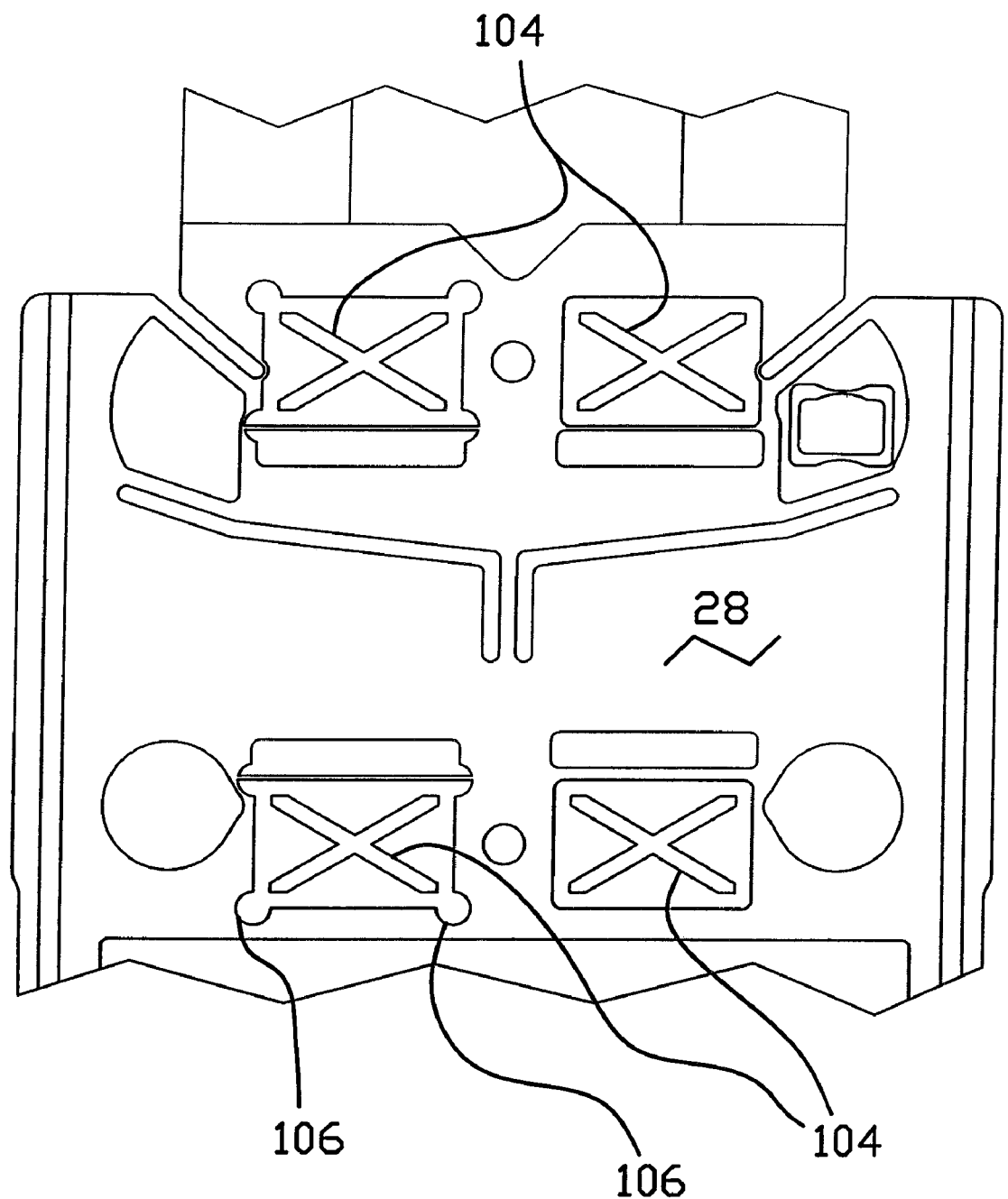
FIG. 11a is a photograph of a PZT mounting region according to a seventh embodiment of the present invention.
Figure 11B:
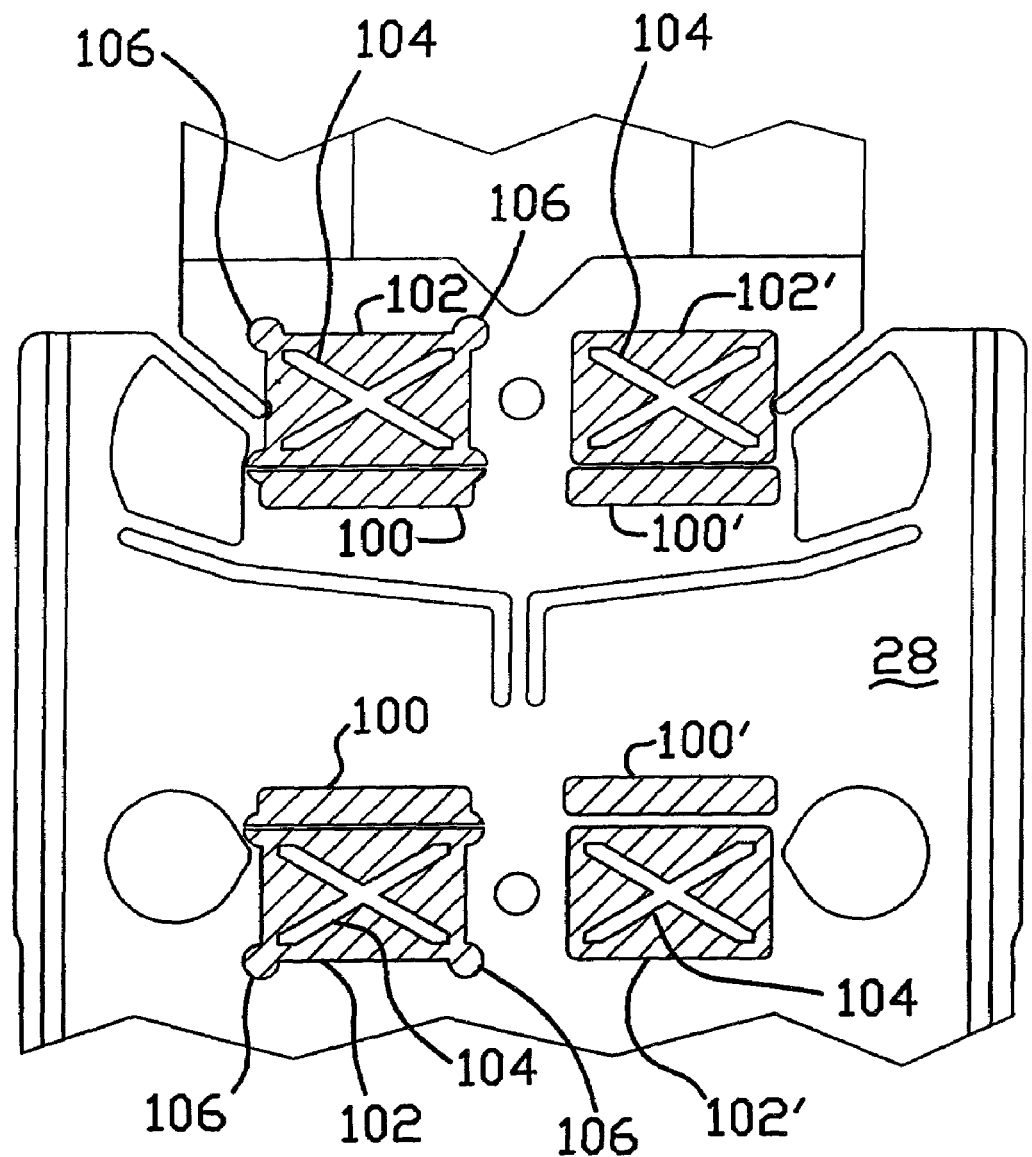
FIG. 11b is a drawing corresponding to a PZT attachment feature of FIG. 11a with recessed areas shown hatched.

Referring now to FIGS. 11*a* and 11*b*, a first design in Category C may be seen. In FIG. 11*b*, the hatched areas 100, 102 and 100', 102' indicate recesses in the load beam material 36. In category C design #1 the whole area under the motor adhesive joint was recessed except for an X shaped land 104. The intention of this design is to draw the adhesive to the corners of the bond area by capillary action of the adhesive between the motor and the X on the suspension These parts looked very good except for not having full bond pads. The large recessed area requires a large volume of adhesive to fill. There was virtually no fillet on any of these parts but there were a few parts with wicking. Fuller bond pads and a stop to wicking are both believed to be achievable by adding a larger unetched area in the center of the pad. The left hand version has circular projections 106, similar to projections 78 in Category B, first design shown in FIGS. 8*a* and 8*b*.

Figure 12A:
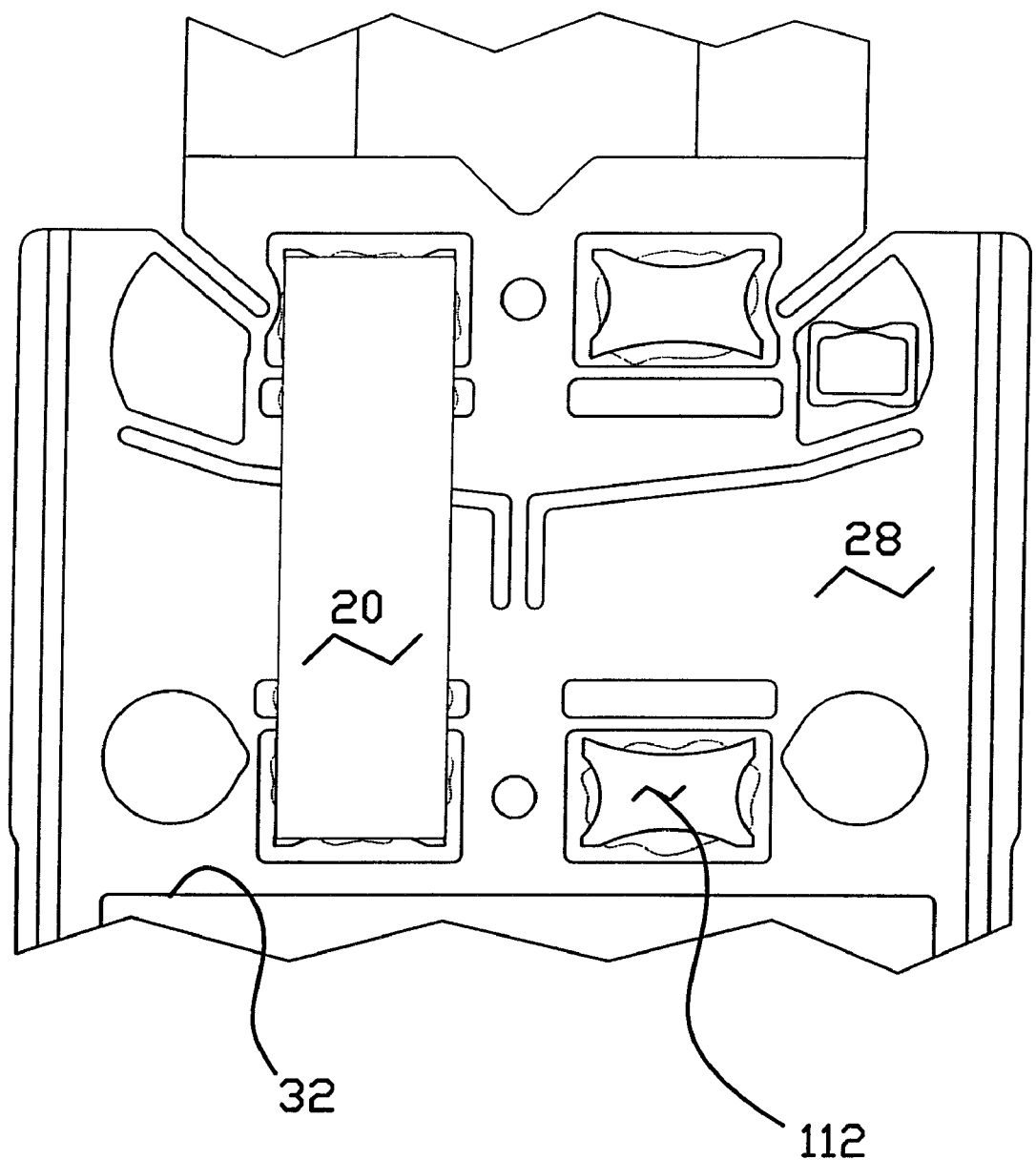
FIG. 12a is a photograph of a PZT mounting region according to an eighth embodiment of the present invention, with one PZT motor attached and one PZT motor removed.
Figure 12B:
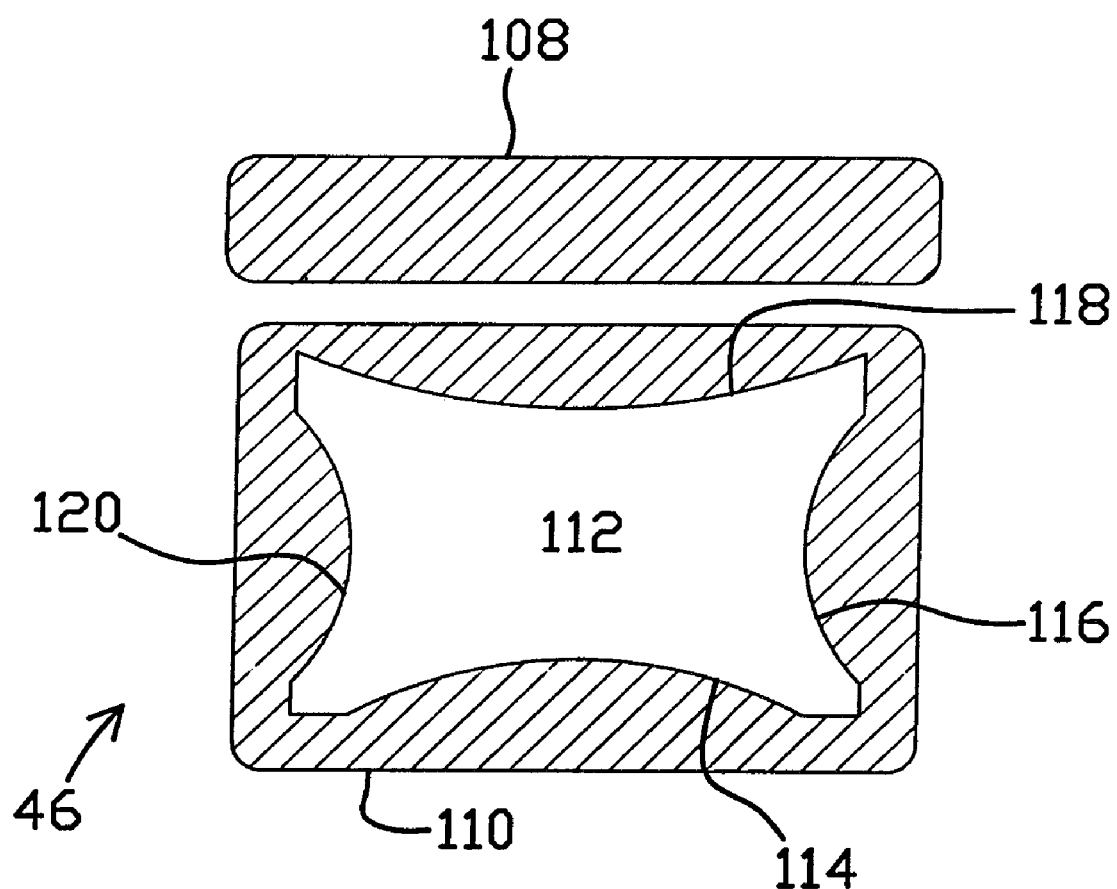
FIG. 12b is an enlarged drawing of a PZT attachment feature of FIG. 12a, with hatched areas indicating recesses in the substrate to which the PZT motor is to be attached.

Referring now to FIGS. 12*a* and 12*b*, a second design in Category C may be seen. The hatched areas 108, 110 in FIG. 12*b* indicate relieved portions in the bond pad area 46 of the substrate 28. Category C design #2 is similar to #1 but with a larger land or unrecessed center area 112 with more material in the corners of the land. The concave sides 114,116, 118, and 120 of the land 112 help prevent the adhesive fillets from traveling up the sides of the motors 20 but they also decrease the bond pad area. Smaller bond pad area decreases the shear strength of the joint. This design has promise and would be enhanced with a stronger adhesive.

Figure 13A:
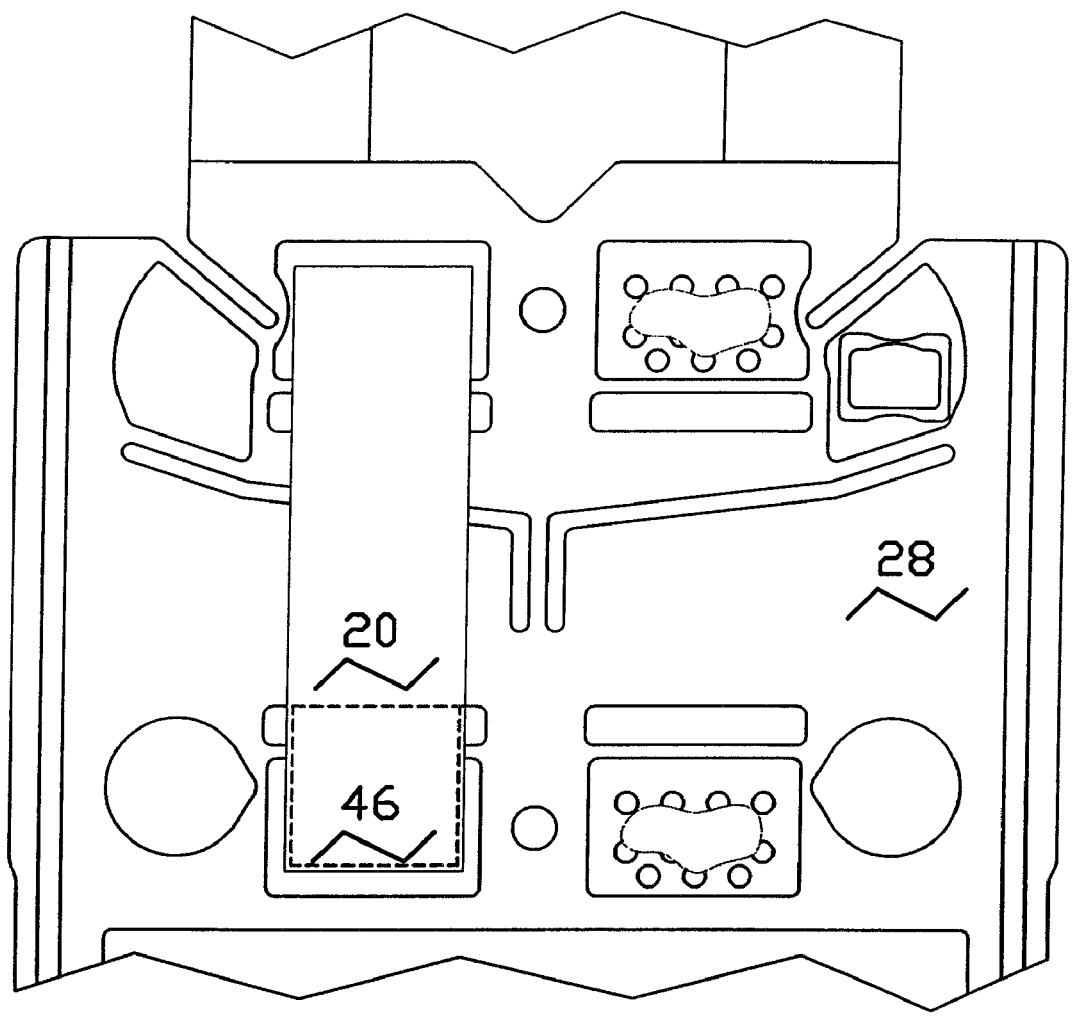
FIG. 13a is a photograph of a PZT mounting region according to a ninth embodiment of the present invention with one PZT motor attached and one PZT motor removed to show the adhesive pattern achieved under the motor.
Figure 13B:
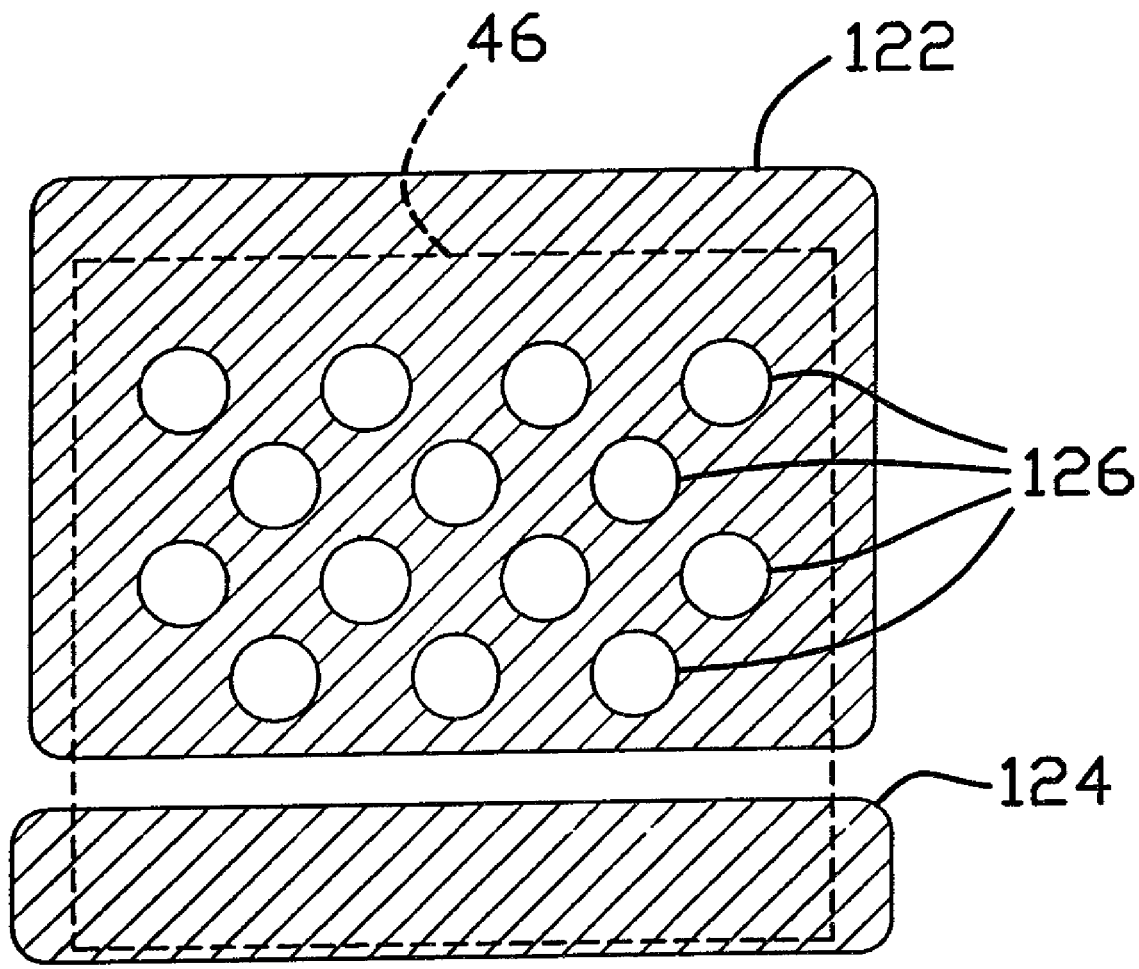
FIG. 13b is a drawing corresponding to a PZT attachment feature of FIG. 13a with recessed areas in the substrate shown hatched.

Referring now to FIGS. 13*a* and 13*b*, a third design in Category C may be seen. In FIG. 13*b*, the hatched areas 122, 124 indicate recessed regions in the bond pad area 46. Category C design #3 is characterized by the bond pad area being substantially fully recessed except with a series of round towers or cylindrical lands 126. This design has a very large recessed area and, as a result, was severely lacking on adhesive volume, due to the unavailability of an increase in adhesive dose delivery. As a consequence, this version was modified to have less recessed area, resulting in design #4.

Figure 14A:
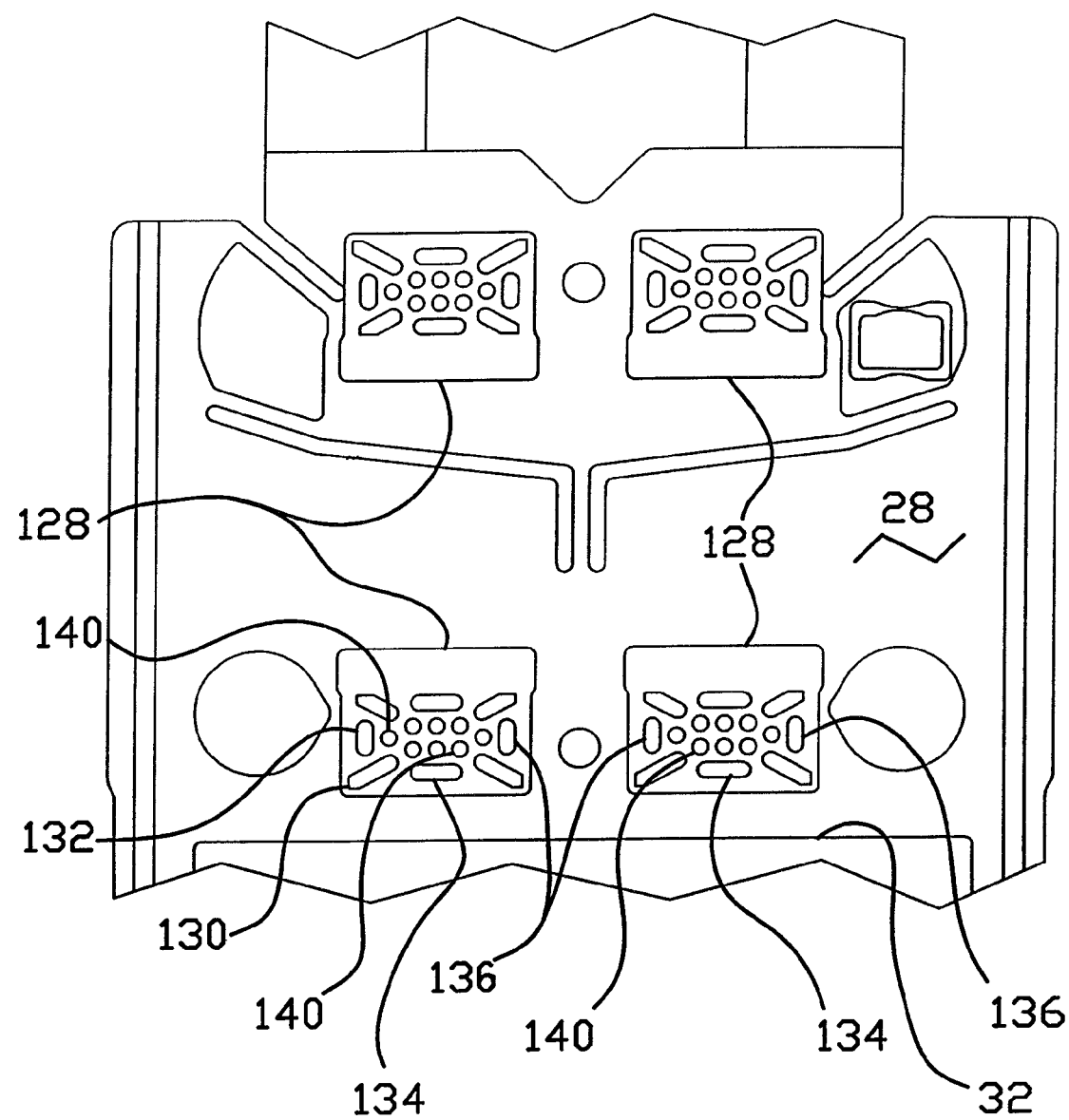
FIG. 14a is a photograph of a PZT mounting region according to a tenth embodiment of the present invention.
Figure 14B:
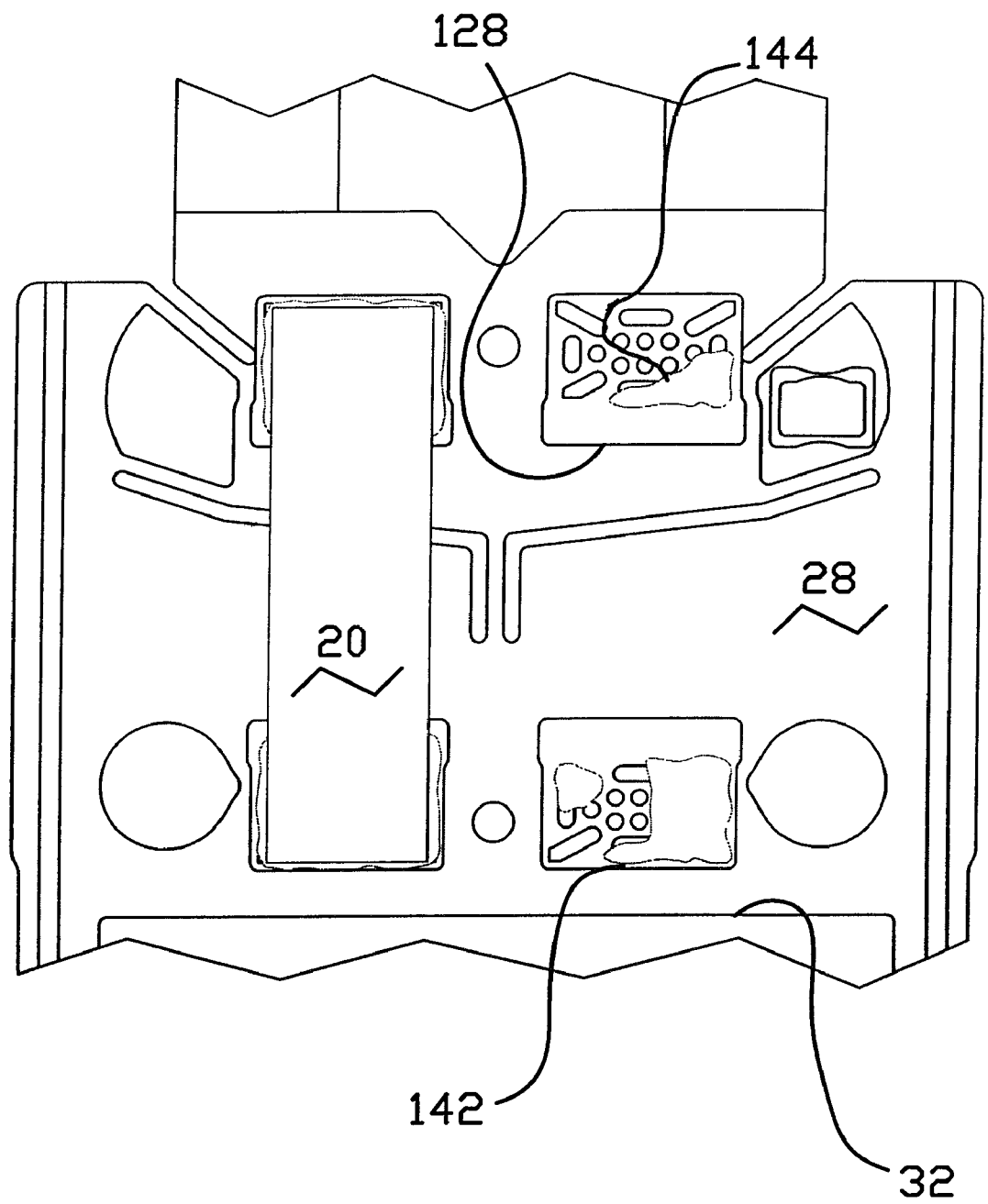
FIG. 14b is a photograph similar to that of FIG. 14a, except with one PZT motor attached and with one PZT motor removed to show the adhesive pattern achieved under the motor.
Figure 14C:
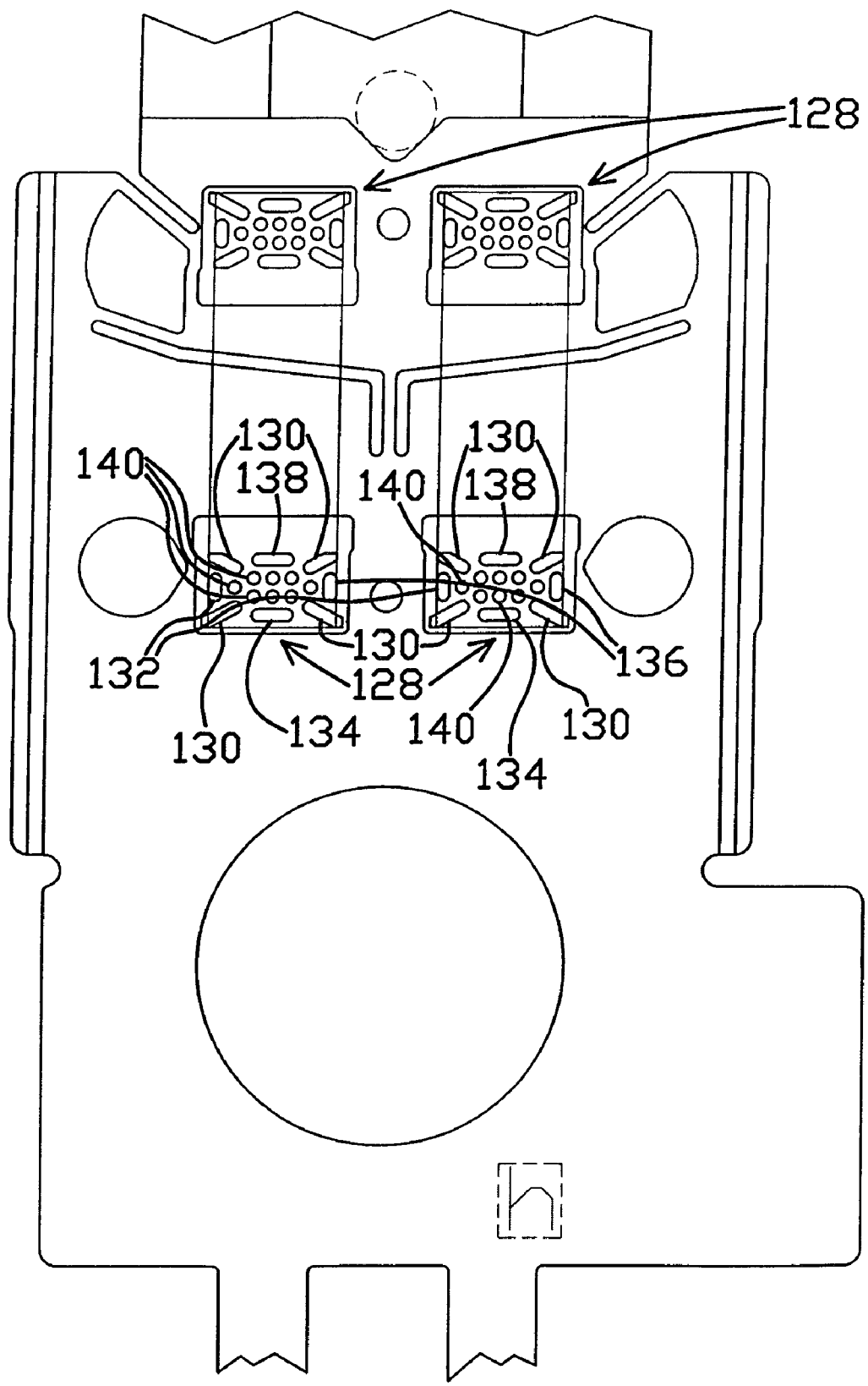
FIG. 14c is a drawing of a portion of a load beam substrate with a mounting region corresponding to FIG. 14a to more clearly show aspects of the attachment feature of this embodiment.

Referring now to FIGS. 14*a*, 14*b*, and 14*c*, a fourth design in Category C may be seen. FIG. 14*c* is a line drawing to more clearly illustrate the recess pattern 128 shown in microphotograph 14*a*. Category C design #4 is similar to #3. The raised X shaped land concept from design C-#1 is used in lands 130 in the corners to wick the adhesive out and make a full bond site. A straight raised bar (land) 132,134, 136, 138 on each of the four sides is used to help stop the adhesive flow and create a more square shaped bond pad. The round raised features or lands 140 add strength and decrease the adhesive volume required. This design has the highest average shear strength from among the designs shown herein. However, it also had the highest standard deviation. Even though this design uses more adhesive, delivered with larger transfer pins, several bond pads were not complete, as may be noted by observation of the adhesive masses 142, 144 in FIG. 14*b*. As can be seen in FIG. 14*b*, there were no fillets with this design variation. The incomplete bond pads are believed to be the reason for the higher standard deviation.

Figure 15A:
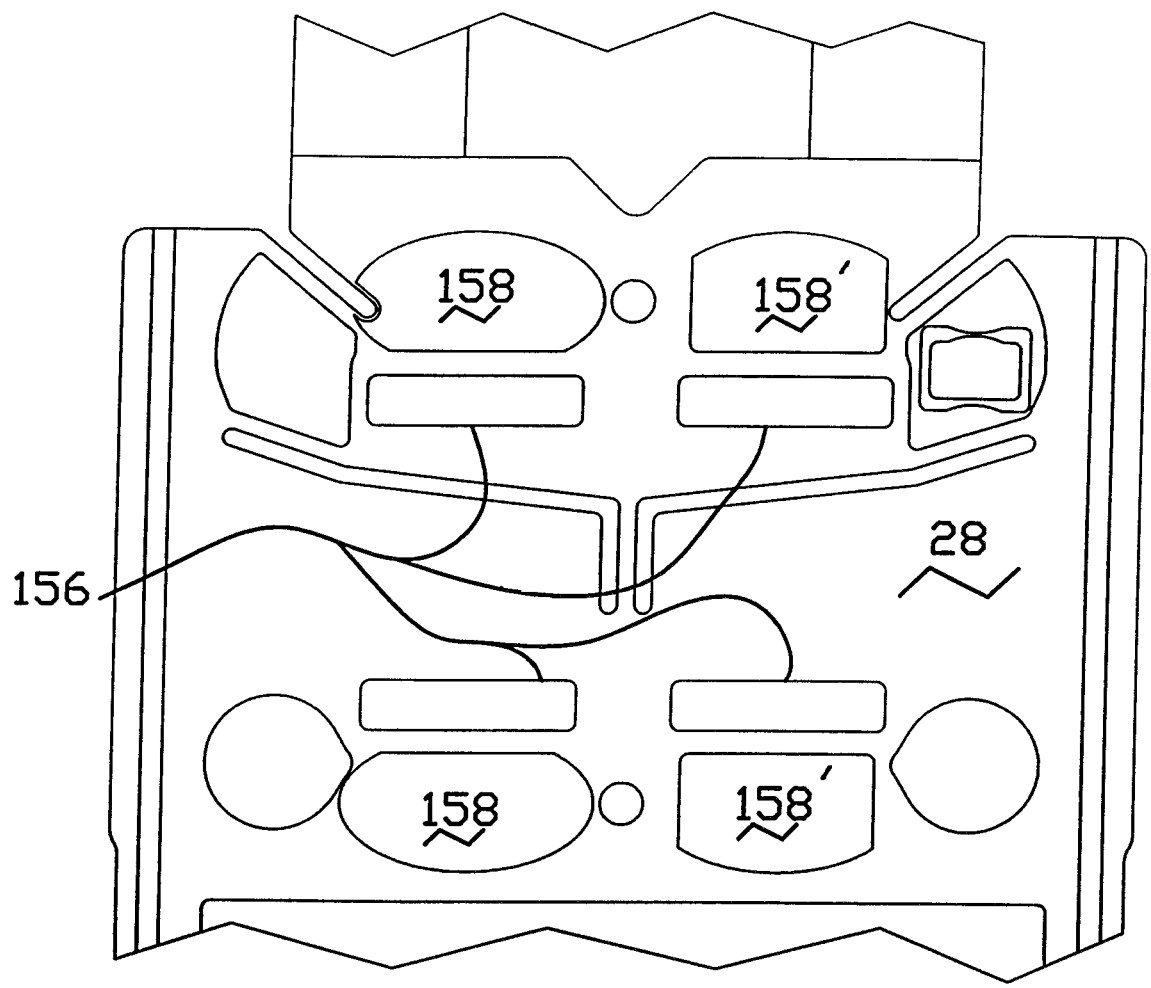
FIG. 15a is a photograph of a PZT mounting region according to an eleventh embodiment of the present invention.
Figure 15B:
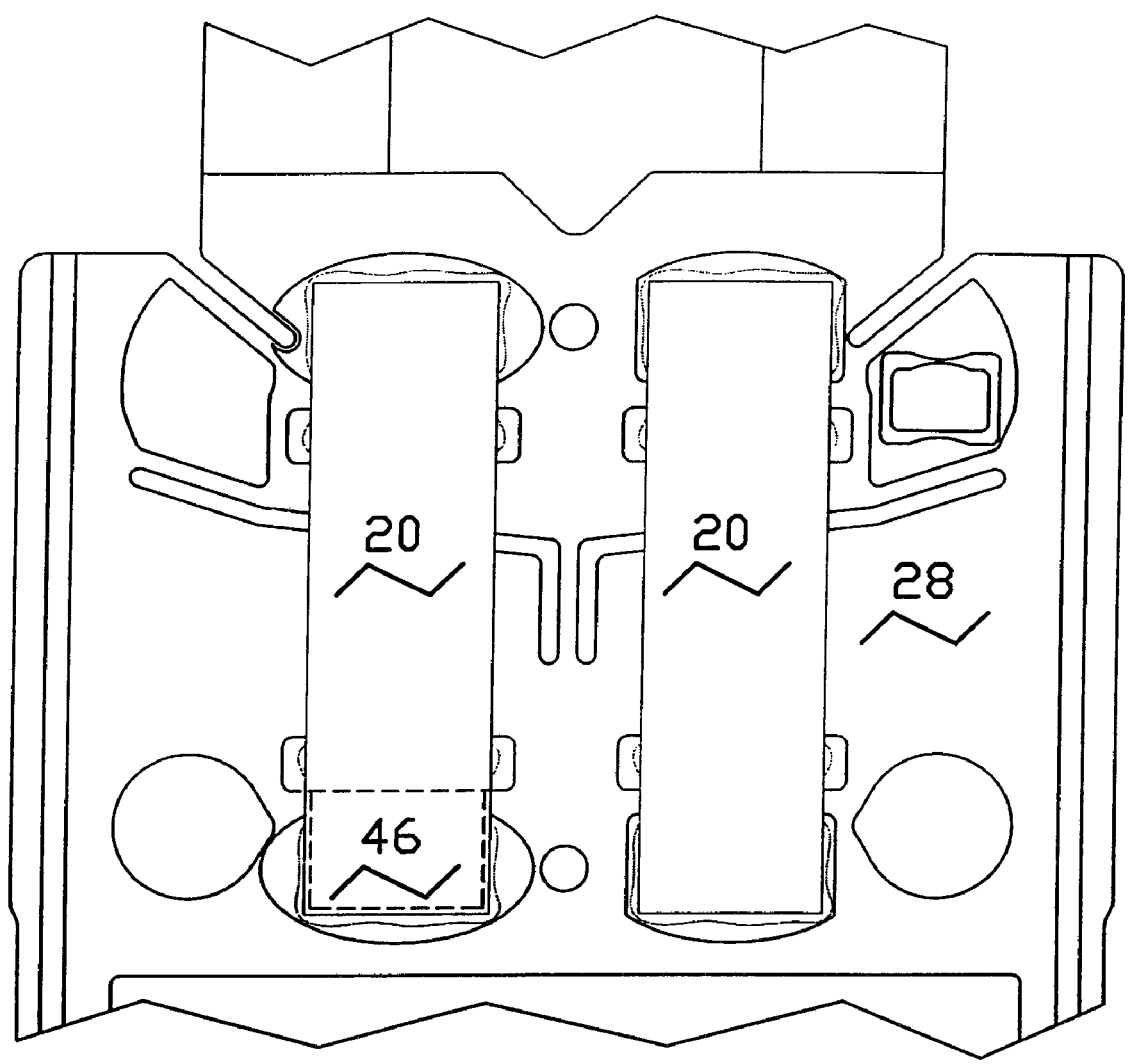
FIG. 15b is a photograph corresponding to FIG. 15a, except with a pair of PZT motors shown attached.
Figure 15C:
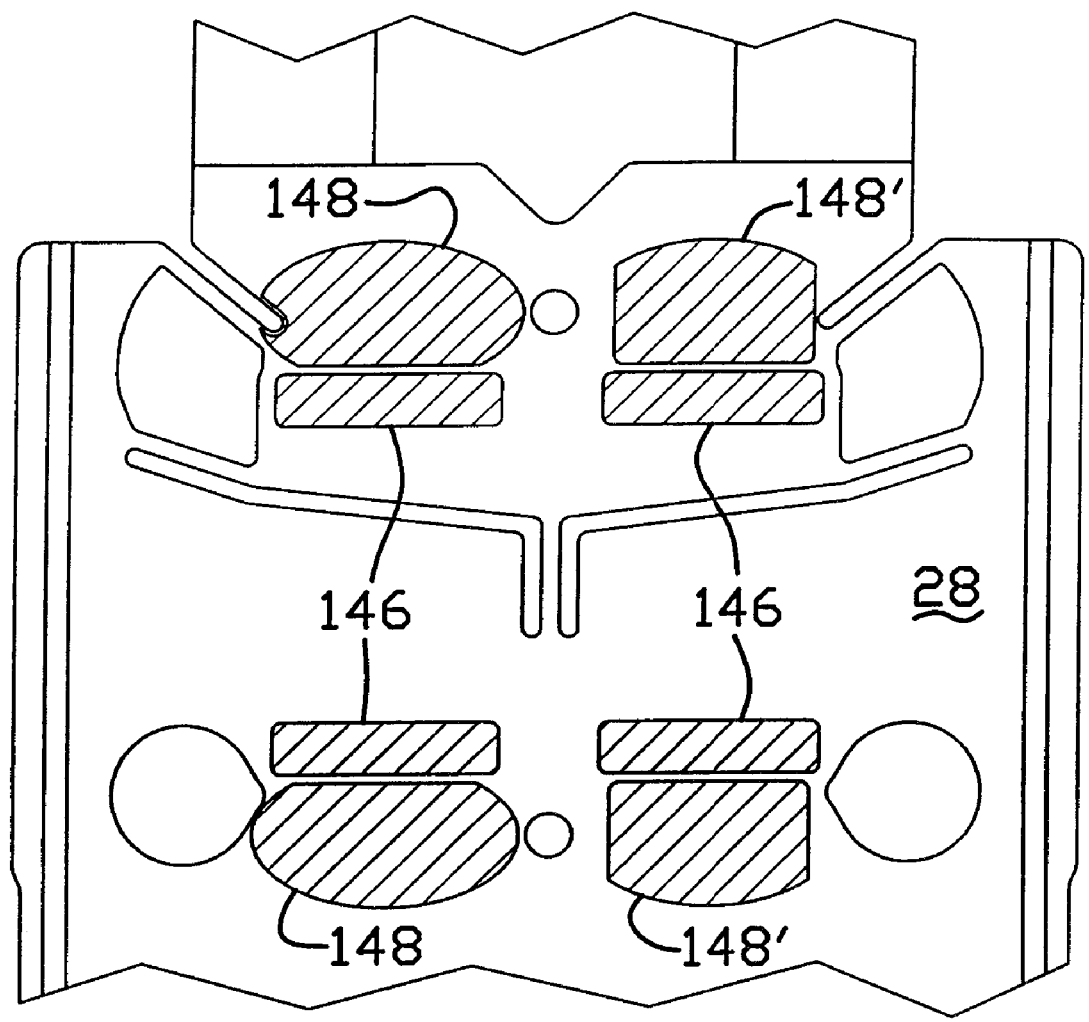
FIG. 15c is a drawing corresponding to FIG. 15a to more clearly show aspects of this embodiment with recessed areas in the substrate hatched.

Referring now to FIGS. 15*a*, 15*b*, and 15*c*, a fifth design in Category C may be seen. In FIG. 15*c*, the hatched regions 146, 148, 148' indicate where material was removed from the stainless steel load beam or substrate, resulting in cavities or recesses 156, 158, and 158' (see FIG. 15*a*) corresponding to the hatched regions. Category C design #5 is an early design with the whole motor bond pad area 46 recessed. This part design had good shear strengths even with small bond areas. This was believed to be largely due to substantial wicking adding to the shear strength. This wicking of adhesive down the center portion of the motor greatly increases the bond surface area. It is believed that a significant unetched area or land under the motor or a large volume of adhesive is desirable to provide a thick enough bondline to prevent wicking. It is to be understood that it is preferable that the center portion of the PZT motor be spaced from the stainless steel by a sufficient amount to prevent wicking. The spacing must be such that capillary action does not draw the adhesive into the gap between the motor and the stainless steel. The unetched areas allow filler particles in the adhesive (such as silver particles) to set the spacing to be equal to the largest diameter particles to create the desired gap. The raised area is selected to be large enough to contain sufficient particles to support the motor and not be crushed or driven out of the unetched area. Alternatively, with sufficient, relatively high viscosity adhesive, a sufficient gap can be created without the use of particles to set the gap dimension.

From the above, it may be seen that the present invention may take on various forms. In all embodiments, the invention includes improvements to the prior art adhesive control relief that extended across the substrate at an inboard end of a bond pad area transversely to the PZT and for a distance generally equal to the width of the PZT. The present invention includes one or more reliefs that also extend around one or more of the outboard end and lateral sides of the bond pad area, and may include a relieved portion under the PZT directly in the bond pad area. The reliefs of the present invention are formed by reducing the height of the substrate, preferably by etching away material from the planar surface adjacent the PZT in the bond pad area of substrate.

In a first embodiment, the present invention includes a relieved portion of the substrate only at the edges of the motor. In one variation of the first embodiment, reliefs extend around the outboard end and lateral sides of the bond pad area in a connected, linear pattern. This variation of the first embodiment forms a continuously extending, rectangular trough or moat around the bond pad area. In another variation of the first embodiment, the reliefs extend along the outboard end and lateral sides of the bond pad area, but are in the form of interrupted segments. In still another variation of the first embodiment, the relieved portion forms an oval trough surrounding a majority of the bond pad area. The oval trough can have an oval outer periphery or an oval segment on the outboard end, with linear segments on the inboard end and lateral sides of the bond pad area. In this variation, the inner periphery of the trough is oval. In each of the variations of the first embodiment, the outer periphery of the relief extends outside of the PZT, while the inner periphery is under the PZT.

In a second embodiment, the present invention includes a relieved portion of the substrate under the motor. In one variation of the second embodiment, a recessed edge relief is included. One form of this embodiment includes an "X" shaped relief in the bond pad area, surrounded and connected with a rectangular box-shaped relief in addition to the prior art inboard transverse relief. Another variation has the ends of the "X" shaped relief extending beyond the corners of the-box shaped relief. Still another variation of the second embodiment includes a relief having a box-shaped (rectangular) outer periphery and an enlarged cross-shaped inner periphery. This variation has, in effect, a generally "clover leaf" shaped land or unrelieved portion, with the bond pad area relief spaced apart and disconnected from the prior art inboard transverse relief. Still another variation of the second embodiment includes an "X" shaped relief connecting the prior art inboard transverse relief with an outboard transverse relief, omitting lateral or side reliefs for the bond pad area.

In a third embodiment, the present invention includes a majority portion of the bond pad area of the substrate relieved, with a minority portion of the bond pad area left unrelieved. In one variation of this embodiment, substantially all of the bond pad area is relieved, with an "X" shaped land within a rectangular recess. In a second variation of this embodiment, the land has concave faces within the rectangular recess. In a third variation, a rectangular recess has a plurality of cylindrical lands or towers. In a fourth version of this embodiment, a plurality of cylindrical towers (centrally located) is combined with a segmented lands forming both an "X" and a rectangle within the rectangular recess, with the rectangular recess preferably extending slightly beyond the PZT motor at the outboard end and lateral sides of the bond pad area. In a fifth version of this embodiment, the entire bond pad area is recessed, with a transverse land extending across the PZT between the bond pad area and the prior art transverse recess. In this version, the outboard end of the bond pad area recess is convex, and the lateral sides may be convex or linear.

What is claimed is:

1. An improved adhesive control substrate relief for bonding a piezoelectric motor to a substrate including a plurality of diagonally oriented relieved portions of the substrate under the motor in a bond pad area.

2. The substrate of claim 1 wherein the relieved portions form an "X" shape.

3. The substrate of claim 1 further comprising a relieved portion at an outboard end of the bond pad area.

4. The substrate of claim 3 further comprising additional relieved portions extending on lateral sides of the bond pad area.

5. The substrate of claim 3 wherein the relieved portion at the outboard end is positioned to be partially under the outboard end of the piezoelectric motor.

6. The substrate of claim 4 wherein the relieved portion comprises an "X" shaped relief surrounded and connected with a peripheral box shaped relief.

7. The substrate of claim 6 further comprising projections extending beyond at least some of the corners of the box shaped relief.

* * * * *